(12) United States Patent
Tao et al.

(10) Patent No.: US 9,547,046 B2
(45) Date of Patent: Jan. 17, 2017

(54) PERFORMANCE DETERIORATION DETECTING APPARATUS AND PERFORMANCE DETERIORATION DETECTING METHOD FOR ENERGY STORAGE DEVICE, AND ENERGY STORAGE SYSTEM

(71) Applicant: GS Yuasa International Ltd., Kyoto-Shi, Kyoto (JP)

(72) Inventors: Yohei Tao, Kyoto (JP); Shigeki Yamate, Kyoto (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 0 days.

(21) Appl. No.: 14/648,657

(22) PCT Filed: Nov. 22, 2013

(86) PCT No.: PCT/JP2013/006868
§ 371 (c)(1),
(2) Date: May 29, 2015

(87) PCT Pub. No.: WO2014/083813
PCT Pub. Date: Jun. 5, 2014

(65) Prior Publication Data
US 2015/0301123 A1    Oct. 22, 2015

(30) Foreign Application Priority Data

Nov. 30, 2012  (JP) .................................. 2012-263589
Mar. 1, 2013  (JP) .................................. 2013-041036

(51) Int. Cl.
*G01N 27/416*  (2006.01)
*H02J 7/00*   (2006.01)
(Continued)

(52) U.S. Cl.
CPC ....... *G01R 31/3679* (2013.01); *G01R 31/3627* (2013.01); *H01M 10/052* (2013.01);
(Continued)

(58) Field of Classification Search
CPC ..................... G01R 31/3679; G01R 31/3627
(Continued)

(56) References Cited

U.S. PATENT DOCUMENTS 4,433,294 A * 2/1984 Windebank ........ G01R 31/3627
                                                    320/162
5,994,877 A * 11/1999 Seri ...................... G01R 31/362
                                                    320/132
(Continued)

FOREIGN PATENT DOCUMENTS

JP    H06-342045 A    12/1994
JP    H09-068561 A    11/1997
(Continued)

OTHER PUBLICATIONS

International Search Report issued in Application No. PCT/JP2013/006868, mailed Feb. 4, 2014.

*Primary Examiner* — M'Baye Diao
(74) *Attorney, Agent, or Firm* — Michael Best & Friedrich LLP

(57) ABSTRACT

A performance deterioration detecting apparatus detects an initial state of sudden deterioration in performance of an energy storage device as a performance deterioration start state, and includes: a first acquiring unit configured to acquire a first maximum variation amount as a maximum value of a capacity variation amount that is a degree of variation in current carrying capacity relative to variation in voltage of the charged or discharged energy storage device, regarding a capacity-voltage property at a first time point, indicating relation between the capacity variation amount
(Continued)

and the voltage; a second acquiring unit configured to acquire a second maximum variation amount as a maximum value of the capacity variation amount regarding the capacity-voltage property at a second time point after the first time point; and a performance deterioration determiner configured to determine that the energy storage device is in the performance deterioration start state at the second time point if a variation amount ratio as a ratio of the second maximum variation amount to the first maximum variation amount exceeds a predetermined value.

11 Claims, 24 Drawing Sheets

(51) Int. Cl.
    *H02J 7/04*     (2006.01)
    *G01R 31/36*     (2006.01)
    *H01M 10/052*     (2010.01)
    *H01M 10/48*     (2006.01)
    *H01M 4/505*     (2010.01)
    *H01M 4/525*     (2010.01)

(52) U.S. Cl.
    CPC .............. *H01M 10/48* (2013.01); *H02J 7/00* (2013.01); *G01R 31/3651* (2013.01); *G01R 31/3662* (2013.01); *H01M 4/505* (2013.01); *H01M 4/525* (2013.01); *H02J 7/0047* (2013.01); *Y02E 60/122* (2013.01); *Y02T 10/7011* (2013.01)

(58) Field of Classification Search
    USPC ..................... 324/426; 320/132, 148; 702/63
    See application file for complete search history.

(56) References Cited

U.S. PATENT DOCUMENTS

| | | | |
|---|---|---|---|
| 8,742,725 B2 | 6/2014 | Tsujiko et al. | |
| 8,886,478 B2 | 11/2014 | Fink | |
| 2010/0085008 A1* | 4/2010 | Suzuki | ..................... B25F 5/00 320/112 |

FOREIGN PATENT DOCUMENTS

| | | |
|---|---|---|
| JP | 2002-343444 A | 11/2002 |
| JP | 2008-014702 A | 1/2008 |
| JP | 2009-252381 A | 10/2009 |
| JP | 2010-272365 A | 12/2010 |
| JP | 2012-181037 A | 9/2012 |
| JP | 2012-524247 A | 10/2012 |

\* cited by examiner

Fig. 10A

| | Cycle number | (Cycle number)$^{1/2}$ | Capacity retention ratio (%) | Output direct current resistance increasing rate (%) | Input direct current resistance increasing rate (%) | Alternating current resistance increasing rate (%) | $P_X/P_0$ | Timing of detecting sudden deterioration in performance | |
|---|---|---|---|---|---|---|---|---|---|
| Comparative example 1-1 | 0 | 0.0 | 100.0 | 100 | 100 | 100 | 1.00 | Early | (X) |
| Comparative example 1-2 | 50 | 7.1 | 97.3 | 121 | 117 | 145 | 0.94 | Early | (X) |
| Comparative example 1-3 | 150 | 12.2 | 93.1 | 139 | 133 | 172 | 0.81 | Early | (X) |
| Example 1 | 300 | 17.3 | 82.1 | 173 | 164 | 221 | 0.74 | Appropriate | (○) |
| Comparative example 1-4 | 500 | 22.4 | 29.0 | 456 | 399 | 447 | 0.19 | Late | (X) |

Fig. 12A

| | Cycle number | (Cycle number)$^{1/2}$ | Capacity retention ratio (%) | Output direct current resistance increasing rate (%) | Input direct current resistance increasing rate (%) | Alternating current resistance increasing rate (%) | $P_x/P_0$ | Timing of detecting sudden deterioration in performance |
|---|---|---|---|---|---|---|---|---|
| Comparative example 2-1 | 0 | 0.0 | 100.0 | 100 | 100 | 100 | 1.00 | Early (X) |
| Comparative example 2-2 | 50 | 7.1 | 96.3 | 106 | 104 | 117 | 0.94 | Early (X) |
| Comparative example 2-3 | 150 | 12.2 | 89.4 | 118 | 114 | 123 | 0.87 | Early (X) |
| Example 2 | 300 | 17.3 | 76.6 | 139 | 133 | 150 | 0.80 | Appropriate (O) |
| Comparative example 2-4 | 500 | 22.4 | 48.8 | 244 | 246 | 270 | 0.46 | Late (X) |
| Comparative example 2-5 | 700 | 26.5 | 23.7 | 383 | 421 | 408 | 0.15 | Late (X) |

| | Cycle number | (Cycle number)$^{1/2}$ | Capacity retention ratio (%) | Output direct current resistance increasing rate (%) | Input direct current resistance increasing rate (%) | Alternating current resistance increasing rate (%) | $P_X/P_0$ | Timing of detecting sudden deterioration in performance |
|---|---|---|---|---|---|---|---|---|
| Comparative example 3-1 | 0 | 0.0 | 100.0 | 100 | 100 | 100 | 1.00 | Early (X) |
| Comparative example 3-2 | 50 | 7.1 | 98.7 | 121 | 120 | 132 | 0.97 | Early (X) |
| Comparative example 3-3 | 150 | 12.2 | 94.7 | 141 | 134 | 153 | 0.88 | Early (X) |
| Example 3 | 300 | 17.3 | 84.6 | 166 | 157 | 173 | 0.71 | Appropriate (○) |
| Comparative example 3-4 | 500 | 22.4 | 71.1 | 204 | 191 | 209 | 0.57 | Late (X) |
| Comparative example 3-5 | 700 | 26.5 | 50.7 | 304 | 287 | 321 | 0.36 | Late (X) |

| | Cycle number | (Cycle number)$^{1/2}$ | Output direct current resistance increasing rate (%) | Input direct current resistance increasing rate (%) | Alternating current resistance increasing rate (%) | $P_x/P_0$ at discharge | $P_x/P_0$ at charge | Timing of detecting sudden deterioration in performance |
|---|---|---|---|---|---|---|---|---|
| Comparative example 2-1 | 0 | 0.0 | 100 | 100 | 100 | 1.00 | 1.00 | Early (×) |
| Comparative example 2-2 | 50 | 7.1 | 106 | 104 | 117 | 0.94 | 1.02 | Early (×) |
| Comparative example 2-3 | 150 | 12.2 | 118 | 114 | 123 | 0.87 | 1.00 | Early (×) |
| Example 2 | 300 | 17.3 | 139 | 133 | 150 | 0.80 | 0.74 | Appropriate (○) |
| Comparative example 2-4 | 500 | 22.4 | 244 | 246 | 270 | 0.46 | 0.42 | Late (×) |
| Comparative example 2-5 | 700 | 26.5 | 383 | 421 | 408 | 0.15 | 0.00 | Late (×) |

Fig. 18

| | Cycle number | (Cycle number)$^{1/2}$ | 0.2C capacity retention ratio (%) | $P_X/P_0$ | Timing of detecting sudden deterioration in performance |
|---|---|---|---|---|---|
| Comparative example 2-1 | 0 | 0.0 | 100.0 | 1.00 | Early (×) |
| Comparative example 2-2 | 50 | 7.1 | 96.3 | 1.01 | Early (×) |
| Comparative example 2-3 | 150 | 12.2 | 89.4 | 0.95 | Early (×) |
| Example 2 | 300 | 17.3 | 76.6 | 0.70 | Appropriate (○) |
| Comparative example 2-4 | 500 | 22.4 | 48.8 | 0.50 | Late (×) |
| Comparative example 2-5 | 700 | 26.5 | 23.7 | 0.32 | Late (×) |

Fig. 20

| | Cycle number | (Cycle number)$^{1/2}$ | Capacity retention ratio (%) | $P_X/P_0$ | Timing of detecting sudden deterioration in performance |
|---|---|---|---|---|---|
| Comparative example 2-1 | 0 | 0.0 | 100.0 | 1.00 | Early (X) |
| Comparative example 2-2 | 50 | 7.1 | 96.3 | 0.96 | Early (X) |
| Comparative example 2-3 | 150 | 12.2 | 89.4 | 0.89 | Early (X) |
| Example 2 | 300 | 17.3 | 76.6 | 0.77 | Appropriate (○) |
| Comparative example 2-4 | 500 | 22.4 | 48.8 | 0.49 | Late (X) |
| Comparative example 2-5 | 700 | 26.5 | 23.7 | 0.24 | Late (X) |

PERFORMANCE DETERIORATION DETECTING APPARATUS AND PERFORMANCE DETERIORATION DETECTING METHOD FOR ENERGY STORAGE DEVICE, AND ENERGY STORAGE SYSTEM

TECHNICAL FIELD

The present invention relates to a performance deterioration detecting apparatus and a performance deterioration detecting method configured to detect an initial state of sudden deterioration in performance of an energy storage device, and an energy storage system including an energy storage device and the performance deterioration detecting apparatus.

BACKGROUND ART

An energy storage device like a lithium-ion secondary battery had been used as a power source of mobile equipment such as a notebook computer or a mobile phone. The energy storage device has been recently applied to wider fields and has been used as a power source of an electric vehicle. An energy storage device needs to have long life performance particularly if it is used as a power source of an electric vehicle. Such an energy storage device is expected to be secondarily used as a power source for load leveling after use as a power source of an electric vehicle.

It is accordingly necessary to find a deteriorating state of an energy storage device, and there has been conventionally proposed a technique for accurate detection of a state of an energy storage device (see Patent Document 1, for example). This technique achieves detection of a deteriorating state of a secondary battery according to the property that capacity of a secondary battery linearly decreases relatively to a difference value of the battery capacity, or the property that internal resistance of a secondary battery linearly increases relatively to a difference value of a battery voltage.

PRIOR ART DOCUMENT

Patent Document

Patent Document 1: JP-A-2009-252381

SUMMARY OF THE INVENTION

Problem to be Solved by the Invention

The conventional technique, however, fails to achieve accurate detection of an initial state of sudden deterioration in performance of an energy storage device.

The present invention has been made to solve the problem mentioned above, and an object thereof is to provide a performance deterioration detecting apparatus, a performance deterioration detecting method, and an energy storage system, which achieve accurate detection of an initial state of sudden deterioration in performance of an energy storage device.

Means for Solving the Problem

In order to achieve the object mentioned above, a performance deterioration detecting apparatus for an energy storage device according to an aspect of the present invention is configured to detect an initial state of sudden deterioration in performance of an energy storage device as a performance deterioration start state. The apparatus includes: a first acquiring unit configured to acquire a first maximum variation amount as a maximum value of a capacity variation amount that is a degree of variation in current carrying capacity relative to variation in voltage of the charged or discharged energy storage device, regarding a capacity-voltage property at a first time point, indicating relation between the capacity variation amount and the voltage; a second acquiring unit configured to acquire a second maximum variation amount as a maximum value of the capacity variation amount regarding the capacity-voltage property at a second time point after the first time point; and a performance deterioration determiner configured to determine that the energy storage device is in the performance deterioration start state at the second time point if a variation amount ratio as a ratio of the second maximum variation amount to the first maximum variation amount exceeds a predetermined value.

The present invention can be embodied as such a performance deterioration detecting apparatus for an energy storage device, as well as an energy storage system including an energy storage device and a performance deterioration detecting apparatus configured to detect an initial state of sudden deterioration in performance of the energy storage device. The present invention can be also embodied as a performance deterioration detecting method including the steps of characteristic processes executed by the performance deterioration detecting apparatus. Furthermore, the present invention can be embodied as an integrated circuit equipped with characteristic processors included in the performance deterioration detecting apparatus. Moreover, the present invention can be embodied as a program configured to cause a computer to execute the characteristic processes included in the performance deterioration detecting method, or a recording medium such as a computer-readable compact disc-read only memory (CD-ROM) storing the program. Such a program can be obviously distributed by means of a recording medium such as a CD-ROM or through a transmission medium such as the Internet.

Advantage of the Invention

The present invention achieves accurate detection of an initial state of sudden deterioration in performance of an energy storage device such as a lithium-ion secondary battery.

BRIEF DESCRIPTION OF THE DRAWINGS

FIG. 10A is a chart of determination results of the performance deterioration start state of the battery A for explanation of the processes of determining that the energy storage device is in the performance deterioration start state at the second time point with the performance deterioration determiner according to the embodiment of the present invention.

FIG. 12A is a chart of determination results of a performance deterioration start state of the battery B for explaining that the predetermined value referred to by the performance deterioration determiner according to the embodiment of the present invention is preferably in the range from 0.7 to 0.8.

FIG. 14A is a chart of determination results of a performance deterioration start state of the battery C for explaining that the predetermined value referred to by the performance deterioration determiner according to the embodiment of the present invention is preferably in the range from 0.7 to 0.8.

FIG. 16 is a chart of determination results of the performance deterioration start state in a case of acquiring the capacity-voltage property as the differential property of the charge curve of the energy storage device according to the embodiment of the present invention.

FIG. 18 is a chart of determination results of the performance deterioration start state in a case of acquiring the capacity-voltage property of the energy storage device according to the embodiment of the present invention subjected to the 0.2 C discharge capacity validation test.

FIG. 20 is a chart of determination results of the performance deterioration start state of the energy storage device according to the embodiment of the present invention in a case of acquiring the capacity-voltage property with the interval of the voltage variation amount being changed.

Figure 1:
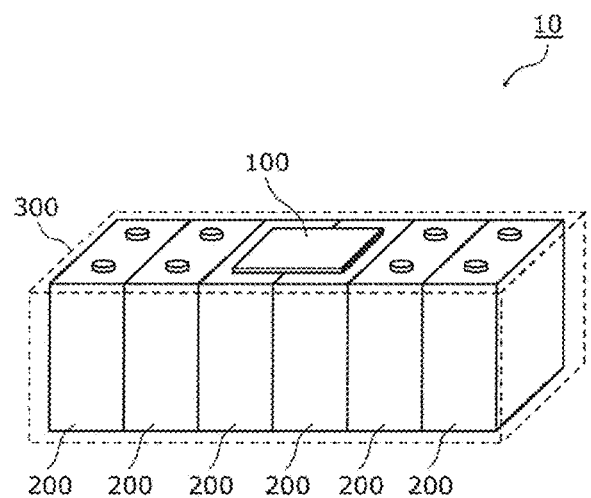
FIG. 1 is an external view of an energy storage system including a performance deterioration detecting apparatus according to an embodiment of the present invention.

MODE FOR CARRYING OUT THE INVENTION (Finding as Basis of the Invention)

The conventional technique fails to achieve accurate detection of an initial state of sudden deterioration in performance of an energy storage device.

A lithium-ion secondary battery equipped in a hybrid vehicle or an electric vehicle particularly has sudden decrease in battery performance at the end of its life. It is thus quite important to accurately detect an initial state of sudden deterioration in battery performance. According to the conventional technique, however, battery capacity and internal resistance indicating battery performance vary linearly. It is thus difficult to preliminarily accurately detect sudden deterioration in performance of the battery.

The present invention has been made to solve the problem mentioned above, and an object thereof is to provide a performance deterioration detecting apparatus, a performance deterioration detecting method, and an energy storage system, which achieve accurate detection of an initial state of sudden deterioration in performance of an energy storage device.

In order to achieve the object mentioned above, a performance deterioration detecting apparatus for an energy storage device according to an aspect of the present invention is configured to detect an initial state of sudden deterioration in performance of an energy storage device as a performance deterioration start state. The apparatus includes: a first acquiring unit configured to acquire a first maximum variation amount as a maximum value of a capacity variation amount that is a degree of variation in current carrying capacity relative to variation in voltage of the charged or discharged energy storage device, regarding a capacity-voltage property at a first time point, indicating relation between the capacity variation amount and the voltage; a second acquiring unit configured to acquire a second maximum variation amount as a maximum value of the capacity variation amount regarding the capacity-voltage property at a second time point after the first time point; and a performance deterioration determiner configured to determine that the energy storage device is in the performance deterioration start state at the second time point if a variation amount ratio as a ratio of the second maximum variation amount to the first maximum variation amount exceeds a predetermined value.

According to this configuration, the performance deterioration detecting apparatus determines that, regarding the capacity-voltage property indicating the relation between the capacity variation amount (dQ/dV) as the degree of variation in current carrying capacity (Q) relative to variation in voltage (V) of the energy storage device and the voltage (V), the energy storage device is in the performance deterioration start state at the second time point if the variation amount ratio as the ratio of the maximum value of the capacity variation amount at the second time point to the maximum value of the capacity variation amount at the first time point exceeds the predetermined value. The inventors of the present application have found, through intensive studies and tests, that the energy storage device starts deteriorating suddenly in performance at the second time point if the variation amount ratio exceeds the predetermined value. The performance deterioration detecting apparatus can thus accurately detect an initial state of sudden deterioration in performance of the energy storage device.

The performance deterioration determiner can determine that the energy storage device is in the performance deterioration start state by determining at the second time point that the energy storage device is in an initial state of sudden deterioration in chargeable or dischargeable capacity of the energy storage device or in an initial state of sudden deterioration in input-output performance indicated by an input-output property of the energy storage device if the variation amount ratio exceeds the predetermined value.

The inventors of the present application have found, through intensive studies and tests, that the capacity or the input-output performance of the energy storage device starts deteriorating suddenly at the second time point if the variation amount ratio exceeds the predetermined value. The fact that the capacity or the input-output performance of the energy storage device starts deteriorating suddenly indicates that the performance of the energy storage device starts deteriorating suddenly. The performance deterioration detecting apparatus detects that the capacity or the input-output performance of the energy storage device starts deteriorating suddenly so as to accurately detect an initial state of sudden deterioration in performance of the energy storage device.

The performance deterioration determiner can determine that the energy storage device is in the performance deterioration start state at the second time point if the variation amount ratio exceeds the predetermined value set to a range from 0.7 to 0.8.

The inventors of the present application have found, through intensive studies and tests, that the energy storage device starts deteriorating suddenly in performance at the second time point if the variation amount ratio exceeds the predetermined value set to the range from 0.7 to 0.8. The performance deterioration detecting apparatus can thus accurately detect an initial state of sudden deterioration in performance of the energy storage device.

The first acquiring unit can acquire the first maximum variation amount regarding the capacity-voltage property of the energy storage device in an initial state.

According to this configuration, the performance deterioration detecting apparatus acquires, as the first maximum variation amount, the maximum value of the capacity variation amount regarding the capacity-voltage property of the energy storage device in the initial state. In a case where the performance deterioration detecting apparatus preliminarily stores in a memory the maximum value of the capacity variation amount of the energy storage device in the initial state, such as at production, factory shipment, or charge-discharge start, the performance deterioration detecting apparatus can easily acquire the first maximum variation amount.

The second acquiring unit can charge or discharge the energy storage device at the second time point to acquire relation between the voltage and the current carrying capacity of the energy storage device, calculate the capacity variation amount by differentiating the current carrying capacity with respect to the voltage in accordance with the acquired relation, and acquire the capacity-voltage property indicating the relation between the calculated capacity variation amount and the voltage to acquire the second maximum variation amount.

According to this configuration, the performance deterioration detecting apparatus charges or discharges the energy storage device at the second time point to acquire the capacity-voltage property, and can thus easily acquire the second maximum variation amount.

The performance deterioration determiner can limit an upper limit charging voltage of the energy storage device if the performance deterioration determiner determines that the energy storage device is in the performance deterioration start state at the second time point.

According to this configuration, the performance deterioration detecting apparatus limits the upper limit charging voltage of the energy storage device if the performance deterioration detecting apparatus determines that the energy storage device is in the performance deterioration start state at the second time point. The performance deterioration detecting apparatus can thus suppress sudden deterioration in performance of the energy storage device and extend its life.

The performance deterioration determiner can limit a maximum flowing current to the energy storage device if the performance deterioration determiner determines that the energy storage device is in the performance deterioration start state at the second time point.

According to this configuration, the performance deterioration detecting apparatus limits the maximum flowing current to the energy storage device if the performance deterioration detecting apparatus determines that the energy storage device is in the performance deterioration start state at the second time point. The performance deterioration detecting apparatus can thus suppress sudden deterioration in performance of the energy storage device and extend its life.

The energy storage device can be a lithium-ion secondary battery including layered lithium transition metal oxide as a positive active material, the first acquiring unit can acquire the first maximum variation amount of the lithium-ion secondary battery, and the second acquiring unit can acquire the second maximum variation amount of the lithium-ion secondary battery.

According to this configuration, the energy storage device is a lithium-ion secondary battery including layered lithium transition metal oxide as the positive active material. The inventors of the present application have found, through intensive studies and tests, that the above method achieves preliminary accurate detection of sudden deterioration in performance of the energy storage device that is embodied as the lithium-ion secondary battery. The performance deterioration detecting apparatus can thus accurately detect an initial state of sudden deterioration in performance of the lithium-ion secondary battery.

A performance deterioration detecting apparatus and an energy storage system including the performance deterioration detecting apparatus according to an embodiment of the present invention will now be described with reference to the drawings. The embodiment to be described below includes preferred specific examples of the present invention. Numerical values, shapes, materials, constituent elements, disposition and connection of the constituent elements, the steps, the order of the steps, and the like to be mentioned in the following embodiment are merely exemplary and will not limit the scope of the present invention. Out of the constituent elements according to the following embodiment, those constituent elements not recited in the independent claims on the superordinate concept of the present invention are to be described as optional constituent elements according to more preferred modes.

A configuration of an energy storage system 10 will be described initially.

FIG. 1 is an external view of the energy storage system 10 including a performance deterioration detecting apparatus 100 according to the embodiment of the present invention.

As depicted in this figure, the energy storage system 10 includes the performance deterioration detecting apparatus 100, a plurality of (six in this figure) energy storage devices 200, and a case 300 accommodating the performance deterioration detecting apparatus 100 and the plurality of energy storage devices 200.

The performance deterioration detecting apparatus 100 is disposed above the plurality of energy storage devices 200, and is a circuit board equipped with a circuit configured to detect an initial state of sudden deterioration in battery performance of plurality of the energy storage devices 200, as a performance deterioration start state. Specifically, the performance deterioration detecting apparatus 100 is connected to the plurality of energy storage devices 200, acquires information from the plurality of energy storage devices 200, and detects a performance deterioration start state of plurality of the energy storage devices 200.

While the performance deterioration detecting apparatus 100 according to the present embodiment is disposed above the plurality of energy storage devices 200, the performance deterioration detecting apparatus 100 can be disposed anywhere. The functional configuration of the performance deterioration detecting apparatus 100 is to be described in detail later.

The energy storage device 200 is a secondary battery such as a nonaqueous electrolyte secondary battery including a positive electrode and a negative electrode. In this figure, the six rectangular energy storage devices 200 are disposed in series as assembled batteries. The number of the energy storage devices 200 is not limited to six, but can be any other plural number or can be one. Furthermore, the energy storage devices 200 are not particularly limited in shape.

The energy storage device 200 has the positive electrode and the negative electrode. The positive electrode includes positive electrode substrate foil in a long belt shape made of aluminum, aluminum alloy, or the like, and a positive active material layer provided on the positive electrode substrate foil. The negative electrode includes negative electrode substrate foil in a long belt shape made of copper, copper alloy, or the like, and a negative active material layer provided on the negative electrode substrate foil. The positive active material in the positive active material layer or the negative active material in the negative active material layer can be made of any appropriate known material if the positive active material or the negative active material can occlude and emit lithium ions.

The energy storage device 200 is preferably a lithium-ion secondary battery including layered lithium transition metal oxide as the positive active material. Specifically, preferred examples of the positive active material include layered lithium transition metal oxide such as $Li_{1+x}M_{1-y}O_2$ (M is one or at least two transition metal elements selected from Fe, Ni, Mn, Co, and the like, and x and y satisfy $0 \leq x < 1/3$ and $0 \leq y < 1/3$) (e.g. $LiNi_{1/3}Co_{1/3}Mn_{1/3}O_2$). The positive active material can include spinel lithium-manganese oxide such as $LiMn_2O_4$ and $LiMn_{1.5}Ni_{0.5}O_4$ or an olivine positive active material such as $LiFePO_4$, which is mixed with the layered lithium transition metal oxide.

Examples of the negative active material include lithium metal, lithium alloy (lithium metal containing alloy such as lithium silicon, lithium aluminum, lithium lead, lithium tin, lithium aluminum tin, lithium gallium, and wood's alloy), lithium occludable and emittable alloy, a carbon material (e.g. graphite, hardly graphitizable carbon, easily graphitizable carbon, low-temperature baked carbon, and amorphous carbon), silicon oxide, metal oxide, lithium metal oxide (e.g. $Li_4Ti_6O_{12}$), a polyphosphoric acid compound. The negative active material preferably has a potential flat portion with a flat electrode potential property, such as a carbon material (e.g. graphite, soft carbon, or hard carbon), $Li_4Ti_5O_{12}$, or $LiMn_2O_4$.

The functional configuration of the performance deterioration detecting apparatus 100 will be described in detail next.

Figure 2:
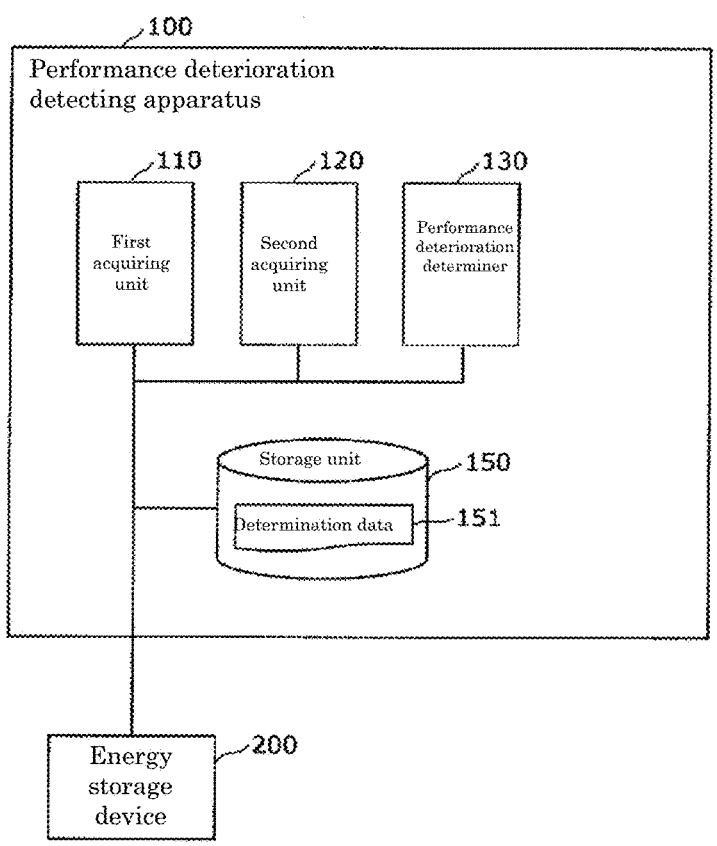
FIG. 2 is a block diagram depicting a functional configuration of the performance deterioration detecting apparatus according to the embodiment of the present invention.

FIG. 2 is a block diagram depicting the functional configuration of the performance deterioration detecting apparatus 100 according to the embodiment of the present invention.

The performance deterioration detecting apparatus 100 detects an initial state of sudden deterioration in performance of the energy storage device 200, as a performance deterioration start state. As depicted in this figure, the performance deterioration detecting apparatus 100 includes a first acquiring unit 110, a second acquiring unit 120, a performance deterioration determiner 130, and a storage unit 150. The storage unit 150 stores determination data 151 for determination of whether or not the energy storage device 200 in the performance deterioration start state.

Regarding a capacity-voltage property at a first time point, indicating relation between voltage and a capacity variation amount as a degree of variation in current carrying capacity relative to variation in voltage of the charged or discharged energy storage device 200, the first acquiring unit 110 acquires a first maximum variation amount as the maximum value of the capacity variation amount. When the voltage of the energy storage device is denoted by V and the current carrying capacity is denoted by Q, the capacity variation amount is expressed by dQ/dV, which is the degree of the variation (dQ) of the current carrying capacity Q relative to the variation (dV) of the voltage V. The first maximum variation amount is to be described in detail later.

The first time point is a reference time point for detection of the performance deterioration start state. At the first time point according to the present embodiment, the energy storage device 200 is in the initial state. The first acquiring unit 110 acquires, as the first maximum variation amount, the maximum value of the capacity variation amount regarding the capacity-voltage property of the energy storage device 200 in the initial state.

Specifically, the maximum value of the capacity variation amount of the energy storage device 200 in the initial state, such as at production, factory shipment, or charge-discharge start, is preliminarily stored as the first maximum variation amount in the determination data 151 in the storage unit 150. The first acquiring unit 110 reads out to acquire the first maximum variation amount from the determination data 151.

The storage unit 150 can alternatively store data on the energy storage device 200 at the first time point such as the capacity-voltage property, and the first acquiring unit 110 can calculate to acquire the first maximum variation amount with reference to the data. Still alternatively, the performance deterioration detecting apparatus 100 may not include the storage unit 150. In this case, the first acquiring unit 110 can acquire the first maximum variation amount from a different device, or the first maximum variation amount can be incorporated in the first acquiring unit 110 by means of a program, a circuit configuration, or the like.

The first time point is not limited to a point during the initial state of the energy storage device 200, but can be at any point. For example, the first time point can be after elapse of a predetermined period from operation start with charge to or discharge from the energy storage device 200. In this case, the first acquiring unit 110 can acquire the first maximum variation amount in a manner similar to how the second acquiring unit 120 acquires a second maximum variation amount. The first time point can be expressed by any unit such as minute, hour, day, or month.

The second acquiring unit 120 acquires the second maximum variation amount as the maximum value of the capacity variation amount regarding the capacity-voltage property at a second time point after the first time point. The second maximum variation amount is to be described in detail later.

The second time point is after the first time point and after elapse of a predetermined period from the operation start with charge to or discharge from the energy storage device 200. The predetermined period is not particularly limited and can be of any length. The predetermined period is not particularly limited in terms of its unit, and can be in the order of minutes, hours, days, or months. The second time point can be accordingly expressed by any unit such as minute, hour, day, or month, similarly to the first time point.

Specifically, the second acquiring unit 120 charges or discharges the energy storage device 200 at the second time point to acquire relation between the voltage and the current carrying capacity of the energy storage device 200. The second acquiring unit 120 acquires the relation by acquiring the voltage and the current carrying capacity from the energy storage device 200 and writing in the determination data 151 in the storage unit 150.

The second acquiring unit 120 then calculates the capacity variation amount by differentiating the current carrying capacity with respect to the voltage in accordance with the acquired relation, and acquires the capacity-voltage property indicating the relation between the calculated capacity variation amount and the voltage. In summary, the second acquiring unit 120 reads out the voltage and the current carrying capacity from the determination data 151, calculates the capacity variation amount by differentiating the current carrying capacity with respect to the voltage, and writes the calculated capacity variation amount in the determination data 151, to acquire the capacity-voltage property.

The second acquiring unit 120 acquires the second maximum variation amount with reference to the acquired capacity-voltage property. The second acquiring unit 120 reads out the maximum capacity variation amount from the determination data 151 to acquire the second maximum variation amount.

Alternatively, the performance deterioration detecting apparatus 100 may not include the storage unit 150. In this case, the second acquiring unit 120 can write data in a different device and read out the data from the different device to acquire the second maximum variation amount.

The performance deterioration determiner 130 determines that the energy storage device 200 is in the performance deterioration start state at the second time point if a variation amount ratio as the ratio of the second maximum variation amount to the first maximum variation amount exceeds a predetermined value. In other words, the performance deterioration determiner 130 calculates the variation amount ratio by dividing the second maximum variation amount by the first maximum variation amount, and determines whether or not the calculated variation amount ratio exceeds the predetermined value. The performance deterioration determiner 130 then determines that the energy storage device 200 is in the performance deterioration start state at the second time point if the calculated variation amount ratio is determined as exceeding the predetermined value.

Specifically, if the variation amount ratio exceeds the predetermined value, the performance deterioration determiner 130 determines that the energy storage device 200 is in an initial state of sudden deterioration in reversible capacity as enough capacity for charging or discharging the energy storage device 200, or an initial state of sudden deterioration in input-output performance indicated by an input-output property of the energy storage device 200, at the second time point, to determine that the energy storage device 200 is in the performance deterioration start state.

The predetermined value is preferably in the range from 0.7 to 0.8. Accordingly, the performance deterioration determiner 130 determines that the energy storage device 200 is in the performance deterioration start state at the second time point if the variation amount ratio exceeds the predetermined value set to the range from 0.7 to 0.8. Specifically, the performance deterioration determiner 130 determines that the energy storage device 200 is in an initial state of sudden deterioration in reversible capacity or input-output performance of the energy storage device 200 at the second time point if the variation amount ratio exceeds the predetermined value set to the range from 0.7 to 0.8, to determine that the energy storage device 200 is in the performance deterioration start state. Why the predetermined value is preferably set to the range from 0.7 to 0.8 is to be described later.

Specifically, the predetermined value (in the range from 0.7 to 0.8) is preliminarily written in the determination data 151 in the storage unit 150, and the performance deterioration determiner 130 reads out the predetermined value from the determination data 151 for the determination described above. The performance deterioration determiner 130 can alternatively acquire the predetermined value from a different device, or can calculate the predetermined value. Still alternatively, the predetermined value can be incorporated in the performance deterioration determiner 130 by means of a program, a circuit configuration, or the like.

If the performance deterioration determiner 130 determines that the energy storage device 200 is in the performance deterioration start state at the second time point, the performance deterioration determiner 130 limits an upper limit charging voltage of the energy storage device 200. In this case, the performance deterioration determiner 130 transmits a signal for limitation of the upper limit charging voltage of the energy storage device 200 to stop charge to the energy storage device 200 before the energy storage device 200 is fully charged.

The performance deterioration determiner 130 can alternatively limit the maximum flowing current to the energy storage device 200 if the performance deterioration determiner 130 determines that the energy storage device 200 is in the performance deterioration start state at the second time point. In this case, the performance deterioration determiner 130 transmits a signal for limitation of the maximum flowing current to the energy storage device 200 to suppress an excessive value of a current flowing to the energy storage device 200.

Alternatively, the performance deterioration determiner 130 can issue an alert before limitation or instead of limitation of the upper limit charging voltage or the maximum flowing current. Still alternatively, the performance deterioration determiner 130 can stop charge to the energy storage device 200 if the performance deterioration determiner 130 determines that the energy storage device 200 is in the performance deterioration start state.

The first and second maximum variation amounts will be described in detail next.

Figure 3:
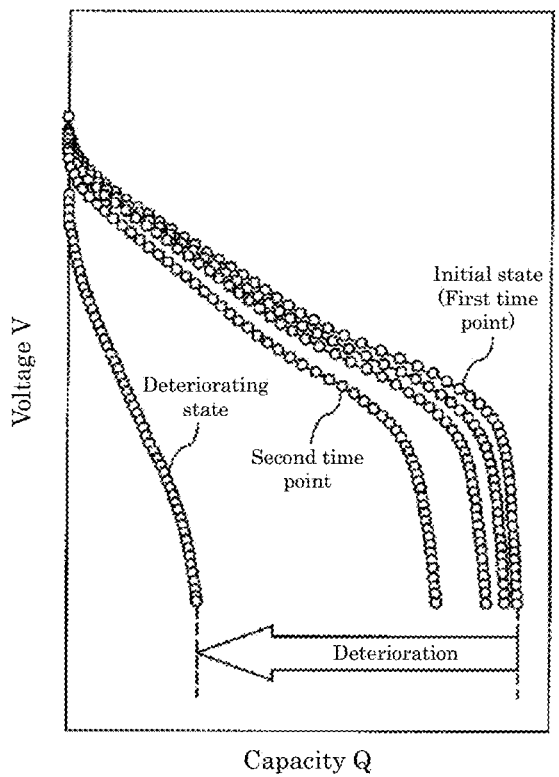
FIG. 3 is an explanatory graph on a first maximum variation amount acquired by a first acquiring unit and a second maximum variation amount acquired by a second acquiring unit according to the embodiment of the present invention.
Figure 4:
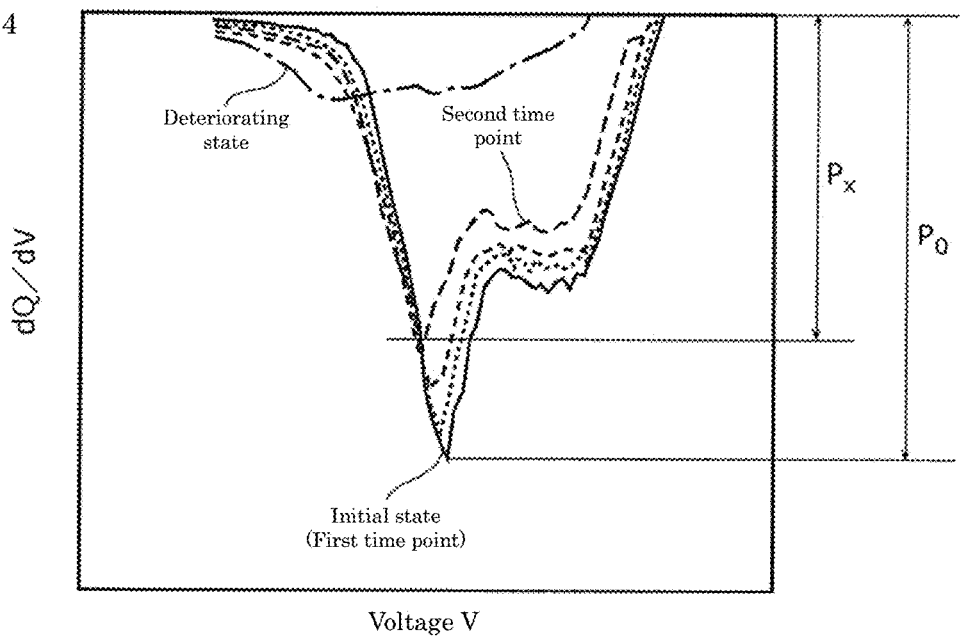
FIG. 4 is an explanatory graph on the first maximum variation amount acquired by the first acquiring unit and the second maximum variation amount acquired by the second acquiring unit according to the embodiment of the present invention.

FIGS. 3 and 4 are explanatory graphs on the first maximum variation amount acquired by the first acquiring unit 110 and the second maximum variation amount acquired by the second acquiring unit 120 according to the embodiment of the present invention. Specifically, FIG. 3 is a graph of the relation between the voltage and the current carrying capacity of the discharged energy storage device 200, whereas FIG. 4 is a graph of the capacity-voltage property of the energy storage device 200.

As indicated in FIG. 3, regarding the relation between the voltage V and the capacity Q of the discharged energy storage device 200, the capacity Q decreases from the first time point to the second time point after elapse of the predetermined period as the energy storage device 200 continuously operates with charge or discharge from the initial state (the first time point). As time further elapses, the capacity Q further decreases and the energy storage device 200 comes into a deteriorating state. The capacity-voltage property indicated in FIG. 4 is obtained by expressing in a graph the relation between the voltage V and the capacity variation amount dQ/dV that is calculated by differentiating the capacity Q indicated in FIG. 3 with respect to the voltage V.

Regarding the capacity-voltage property indicated in FIG. 4, a first maximum variation amount $P_0$ is obtained as the maximum value of the capacity variation amount dQ/dV in the initial state (at the first time point). Regarding the capacity-voltage property, a second maximum variation amount $P_X$ is obtained as the maximum value of the capacity variation amount dQ/dV at the second time point after elapse of the predetermined period from the first time point.

In summary, the first acquiring unit 110 acquires the first maximum variation amount $P_0$ whereas the second acquiring unit 120 acquires the second maximum variation amount $P_X$. FIGS. 3 and 4 are the graphs on the discharged energy storage device 200. Similar graphs will be obtained also in a case where the energy storage device 200 is charged. Similarly to the case where the energy storage device 200 is discharged, the first acquiring unit 110 can acquire the first maximum variation amount $P_0$ whereas the second acquiring unit 120 can acquire the second maximum variation amount $P_X$ also for the charged energy storage device 200. This will apply hereinafter.

The processes of detecting the performance deterioration start state of the energy storage device 200 with the performance deterioration detecting apparatus 100 will be described next.

Figure 5:
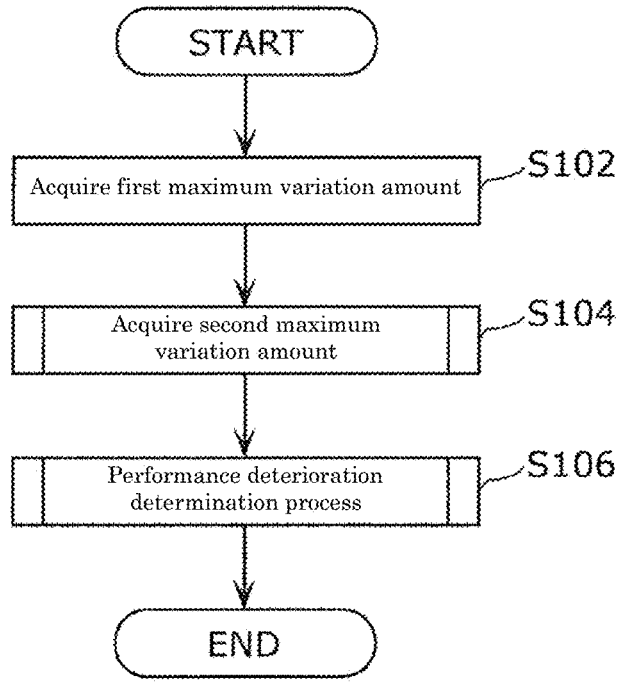
FIG. 5 is a flowchart of exemplary processes of detecting a performance deterioration start state of an energy storage device with the performance deterioration detecting apparatus according to the embodiment of the present invention.

FIG. 5 is a flowchart of exemplary processes of detecting the performance deterioration start state of the energy storage device 200 with the performance deterioration detecting apparatus 100 according to the embodiment of the present invention.

As depicted in this figure, the first acquiring unit 110 initially acquires the first maximum variation amount as the maximum value of the capacity variation amount regarding the capacity-voltage property at the first time point (S102). Specifically, the first acquiring unit 110 acquires the first maximum variation amount as the maximum value of the capacity variation amount regarding the capacity-voltage property of the energy storage device 200 in the initial state by reading out of the determination data 151.

The second acquiring unit 120 subsequently acquires the second maximum variation amount as the maximum value of the capacity variation amount regarding the capacity-voltage property at the second time point after the first time point (S104). Specifically, the second acquiring unit 120 charges or discharges the energy storage device 200 at the second time point to acquire the relation between the voltage and the current carrying capacity of the energy storage device 200, calculates the capacity variation amount by differentiating the current carrying capacity with respect to the voltage in accordance with the acquired relation, and acquires the capacity-voltage property indicating the relation between the calculated capacity variation amount and the voltage, so as to acquire the second maximum variation amount. The processes of acquiring the second maximum variation amount with the second acquiring unit 120 are to be described in detail later.

The performance deterioration determiner 130 then determines that the energy storage device 200 is in the performance deterioration start state at the second time point if the variation amount ratio as the ratio of the second maximum variation amount to the first maximum variation amount exceeds the predetermined value (S106). Specifically, the performance deterioration determiner 130 determines that the energy storage device 200 is in an initial state of sudden deterioration in reversible capacity or input-output performance of the energy storage device 200 at the second time point if the variation amount ratio exceeds the predetermined value, to determine that the energy storage device 200 is in the performance deterioration start state. The processes of determining that the energy storage device 200 is in the performance deterioration start state at the second time point with the performance deterioration determiner 130 are to be described in detail later.

The processes of detecting the performance deterioration start state of the energy storage device 200 with the performance deterioration detecting apparatus 100 thus end.

The processes of acquiring the second maximum variation amount with the second acquiring unit 120 (S104 in FIG. 5) will be described in detail next.

Figure 6:
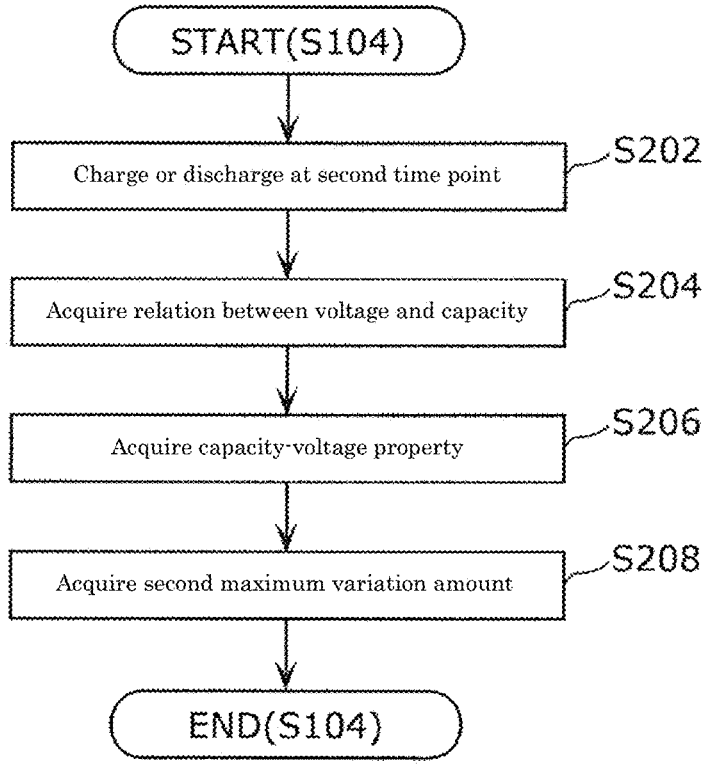
FIG. 6 is a flowchart of exemplary processes of acquiring the second maximum variation amount with the second acquiring unit according to the embodiment of the present invention.
Figure 7:
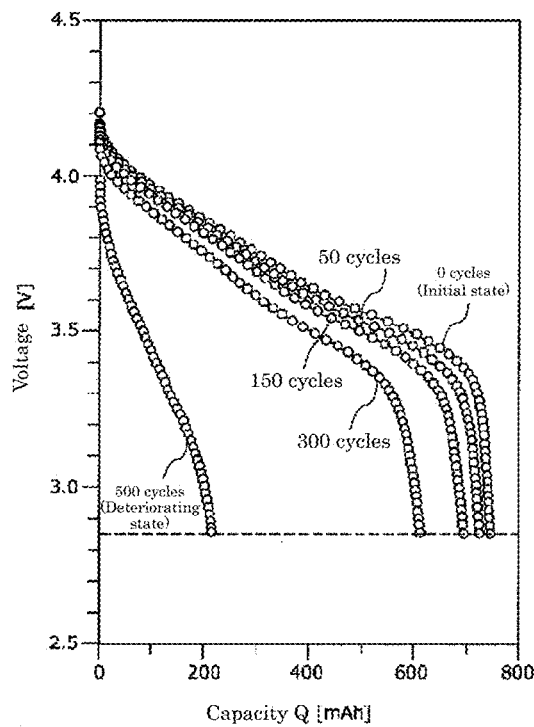
FIG. 7 is an explanatory graph on the processes of acquiring the second maximum variation amount with the second acquiring unit according to the embodiment of the present invention.
Figure 8:
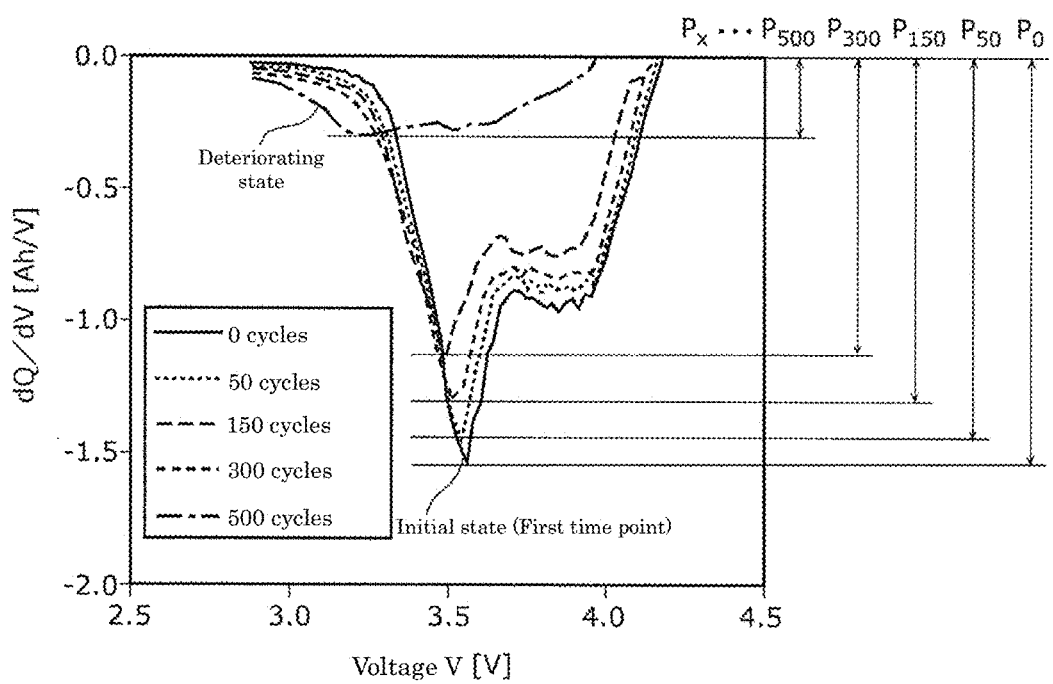
FIG. 8 is a graph of a capacity-voltage property of a battery A for explanation of the processes of acquiring the second maximum variation amount with the second acquiring unit according to the embodiment of the present invention.

FIG. 6 is a flowchart of exemplary processes of acquiring the second maximum variation amount with the second acquiring unit 120 according to the embodiment of the present invention. FIGS. 7 and 8 are explanatory graphs on the processes of acquiring the second maximum variation amount with the second acquiring unit 120 according to the embodiment of the present invention. Specifically, FIG. 7 is a graph of the relation between the voltage and the current carrying capacity of the discharged energy storage device 200, whereas FIG. 8 is a graph of the capacity-voltage property of the energy storage device 200.

A charge-discharge cycle test of repeating charge and discharge under constant conditions is performed for continuous progress of an operation degree of the energy storage device 200, a cycle number in the charge-discharge cycle test is referred to as an index of the operation degree from acquired data in the following description. It is obviously impossible to ordinarily obtain any parameter corresponding to the cycle number because the conditions for charge and discharge, particularly for discharge, are inconstant in actual implementation.

As depicted in FIG. 6, the second acquiring unit 120 initially charges or discharges the energy storage device 200 at the second time point (S202). The following description refers to the case of discharging the energy storage device 200. The following description applies also to the case of charging the energy storage device 200 as described above, and such similar description will not be repeated herein.

The second acquiring unit 120 acquires the relation between the voltage and the current carrying capacity of the energy storage device 200 (S204). Specifically, the second acquiring unit 120 acquires the relation between the voltage V and the capacity Q of the energy storage device 200 as indicated in FIG. 7.

If the operation degree of the energy storage device 200 at the second time point or the like corresponds to 50 cycles in the charge-discharge cycle test, the second acquiring unit 120 acquires data corresponding to the line for "50 cycles" indicated in FIG. 7. Similarly, if the operation degree of the energy storage device 200 at the second time point corresponds to 300 cycles in the charge-discharge cycle test, the second acquiring unit 120 acquires data corresponding to the line for "300 cycles" indicated in this figure.

FIG. 7 specifically exemplifies results of a 1 C cycle test at 45° C. performed as described below. The following test is performed using a lithium-ion secondary battery (hereinafter, referred to as a battery A) including a positive electrode made of aluminum foil provided thereon with a positive composite and a negative electrode made of copper foil provided thereon with a negative composite. The positive composite in the battery A includes a positive active material, polyvinylidene fluoride serving as a binding agent and acetylene black serving as a conductive material. The positive active material is a mixture (at the mass ratio of 7:3) of layered lithium transition metal oxide expressed by $LiNi_{1/3}Co_{1/3}Mn_{1/3}O_2$ and spinel lithium-manganese oxide expressed by $LiMn_2O_4$. The negative composite in the battery A includes a graphite carbon material serving as a negative active material, as well as styrene-butadiene rubber and carboxymethyl cellulose serving as binding agents. The battery A also includes an electrolyte solution that is prepared by adding 1 mol/L of $LiPF_6$ to a solvent mixture of ethylene carbonate (EC):dimethyl carbonate (DMC):ethyl methyl carbonate (EMC)=25:20:55 (at the volume ratio).

In the 1 C cycle test at 45° C., charge is performed by constant-current constant-voltage charge at 45° C., the current of 1 CmA (=650 mA), and the voltage of 4.2 V with charging time of three hours, whereas discharge is performed by constant-current discharge at 45° C., the current of 1 CmA (=650 mA), and the final voltage of 2.85 V. In a discharge capacity validation test, charge is performed by constant-current constant-voltage charge at 25° C., the current of 1 CmA (=650 mA), and the voltage of 4.2 V with charging time of three hours, whereas discharge is performed by constant-current discharge at 25° C., the current of 1 CmA (=650 mA), and the final voltage of 2.85 V. Downtime for 10 minutes is provided between charge and discharge as well as between discharge and charge. The battery is kept in an open circuit state for such downtime. One cycle accordingly includes the four steps of charge, a pause, discharge, and a pause.

Referring again to FIG. 6, the second acquiring unit 120 calculates the capacity variation amount by differentiating the current carrying capacity with respect to the voltage in accordance with the acquired relation to acquire the capacity-voltage property indicating the relation between the calculated capacity variation amount and the voltage (S206). Specifically, the second acquiring unit 120 calculates the capacity variation amount dQ/dV by differentiating the capacity Q with respect to the voltage V regarding the line indicated in FIG. 7. As indicated in FIG. 8, the second acquiring unit 120 then acquires the capacity-voltage property indicating the relation between the calculated capacity variation amount dQ/dV and the voltage V.

More specifically, if the capacity Q varies in value from Q1 to Q2 in accordance with the voltage V that varies in value from V1 to V2, the second acquiring unit 120 calculates the capacity variation amount dQ/dV=(Q2−Q1)/(V2−V1). The second acquiring unit 120 then acquires the capacity-voltage property indicating the relation between the calculated capacity variation amount dQ/dV=(Q2−Q1)/(V2−V1) and the voltage V=(V1+V2)/2.

If the operation degree of the energy storage device 200 at the second time point or the like corresponds to 50 cycles in the charge-discharge cycle test, the second acquiring unit 120 acquires data corresponding to the line for "50 cycles" indicated in FIG. 8. Similarly, if the operation degree of the energy storage device 200 at the second time point corresponds to 300 cycles in the charge-discharge cycle test, the second acquiring unit 120 acquires data corresponding to the line for "300 cycles" indicated in this figure.

Referring again to FIG. 6, the second acquiring unit 120 acquires the second maximum variation amount with reference to the acquired capacity-voltage property (S208). Specifically, the second acquiring unit 120 acquires the second maximum variation amount with reference to the graph of FIG. 8.

If the operation degree of the energy storage device 200 at the second time point or the like corresponds to 50 cycles in the charge-discharge cycle test, the second acquiring unit 120 acquires the value at $P_{50}$ indicated in FIG. 8 as the second maximum variation amount. Similarly, if the operation degree of the energy storage device 200 at the second time point corresponds to 300 cycles in the charge-discharge cycle test, the second acquiring unit 120 acquires the value at $P_{300}$ indicated in this figure as the second maximum variation amount.

The processes of acquiring the second maximum variation amount with the second acquiring unit 120 (S104 in FIG. 5) thus end.

The processes of determining that the energy storage device 200 is in the performance deterioration start state at the second time point with the performance deterioration determiner 130 (S106 in FIG. 5) will be described in detail next.

Figure 9:
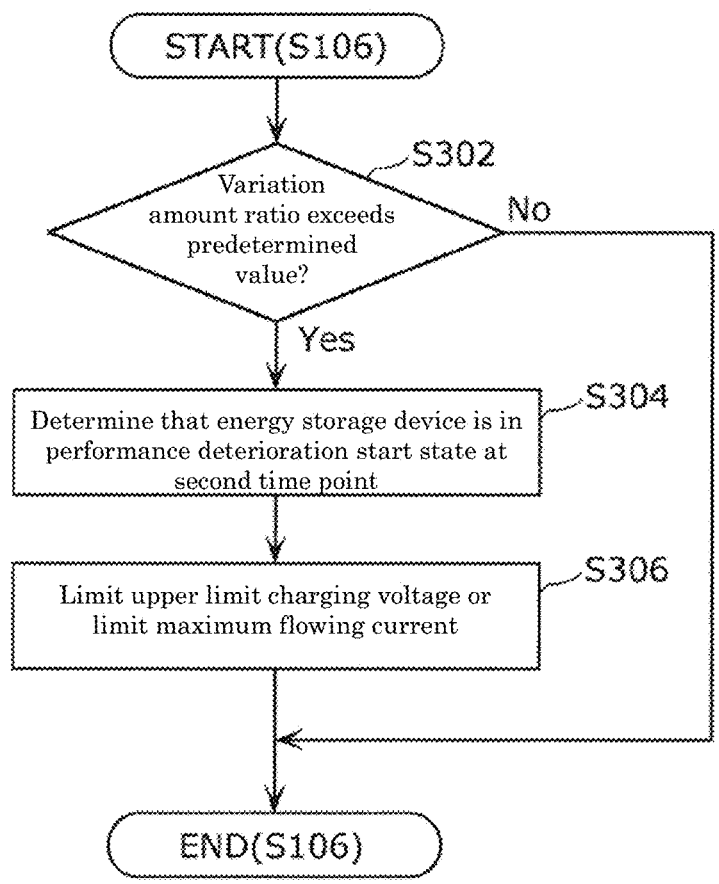
FIG. 9 is a flowchart of exemplary processes of determining that an energy storage device is in the performance deterioration start state at a second time point with a performance deterioration determiner according to the embodiment of the present invention.
Figure 10B:
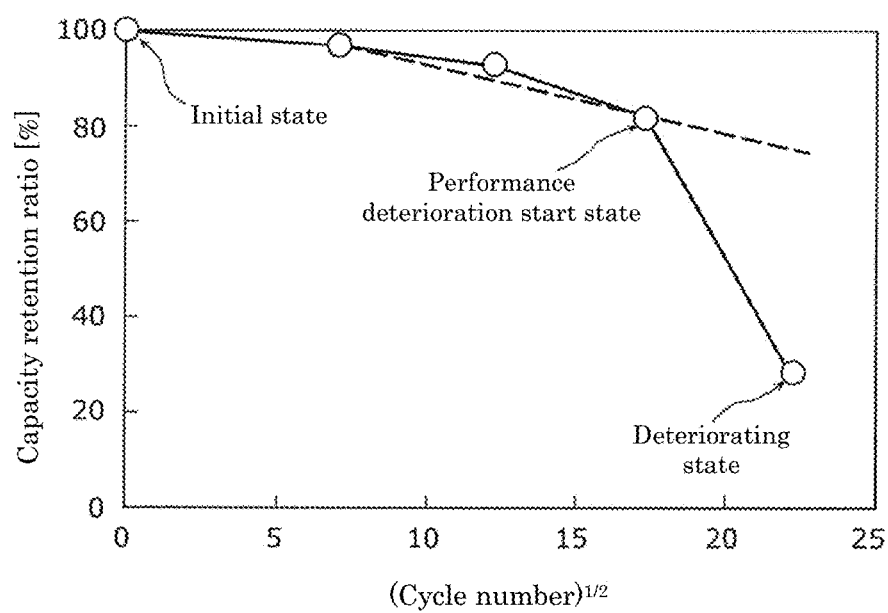
FIG. 10B is a graph indicating transition of a capacity retention ratio of the battery A for explanation of the processes of determining that the energy storage device is in the performance deterioration start state at the second time point with the performance deterioration determiner according to the embodiment of the present invention.
Figure 10C:
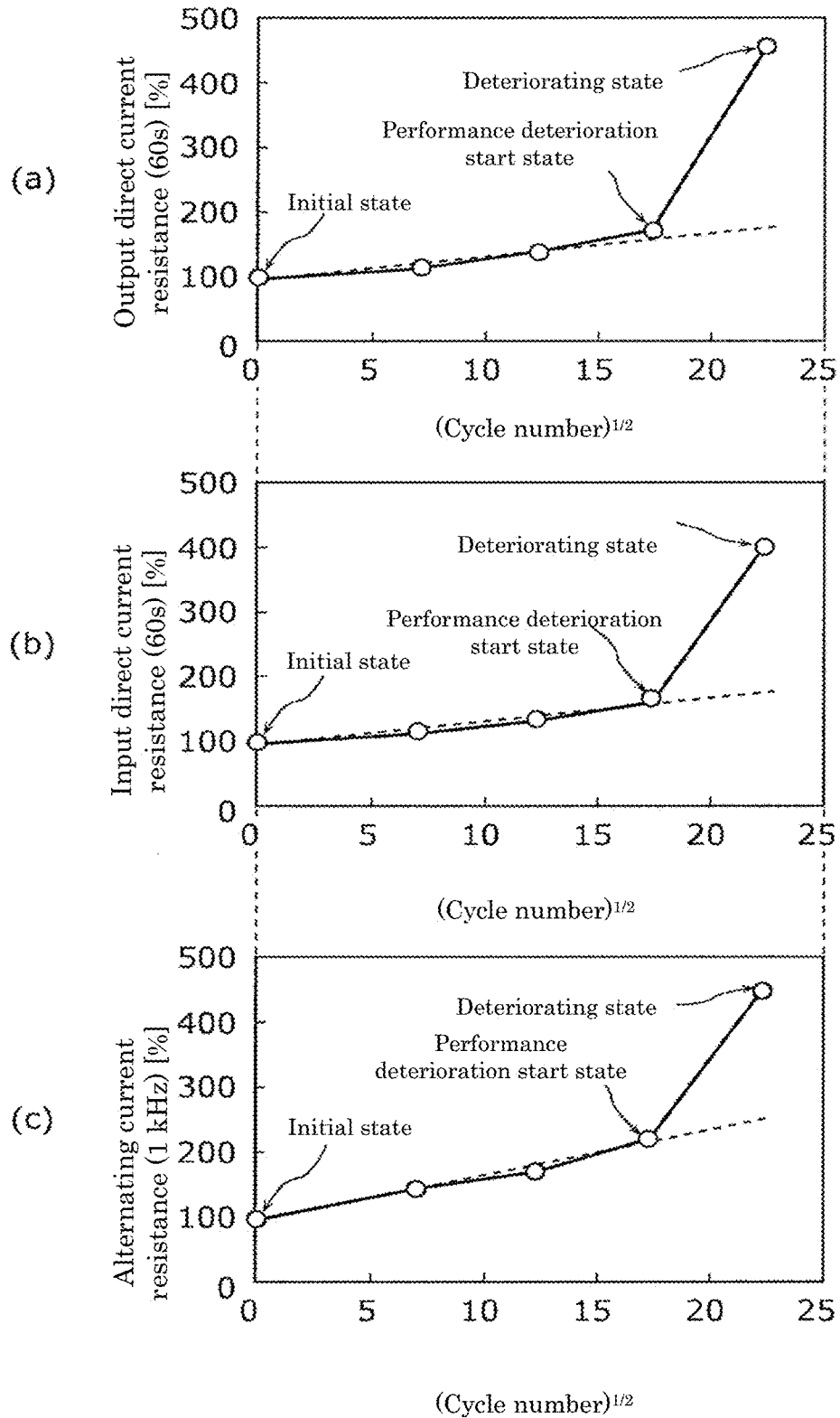
FIGS. 10C(a) to 10C(c) are graphs indicating transition of resistance of the battery A for explanation of the processes of determining that the energy storage device is in the performance deterioration start state at the second time point with the performance deterioration determiner according to the embodiment of the present invention.

FIG. 9 is a flowchart of exemplary processes of determining that the energy storage device 200 is in the performance deterioration start state at the second time point with the performance deterioration determiner 130 according to the embodiment of the present invention. FIGS. 10A to 10C(c) include a chart and graphs for explanation of the processes of determining that the energy storage device 200 is in the performance deterioration start state at the second time point with the performance deterioration determiner 130 according to the embodiment of the present invention.

Specifically, FIG. 10A is a chart indicating values of the variation amount ratio according to the varied operation degree (cycle number) and determination results of the performance deterioration start state in a case where the values of the variation amount ratio are applied to the predetermined value. FIG. 10B is a graph indicating transition of the capacity retention ratio of the energy storage device 200 according to the varied operation degree (cycle number).

FIGS. 10C(a) to 10C(c) are graphs indicating transition of output direct current resistance, input direct current resistance, and alternating current resistance of the energy storage device 200 according to the varied operation degree (cycle number). Particularly, FIG. 10C(a) is a graph indicating transition of a ratio of the output direct current resistance of the energy storage device 200 according to the varied operation degree (cycle number) to the output direct current resistance in the initial state (an output direct current resistance increasing rate in FIG. 10A). FIG. 10C(b) is a graph indicating transition of a ratio of the input direct current resistance of the energy storage device 200 according to the varied operation degree (cycle number) to the input direct current resistance in the initial state (an input direct current resistance increasing rate in FIG. 10A). FIG. 10C(c) is a graph indicating transition of a ratio of the alternating current resistance of the energy storage device 200 according to the varied operation degree (cycle number) to the alternating current resistance in the initial state (an alternating current resistance increasing rate in FIG. 10A).

As depicted in FIG. 9, the performance deterioration determiner 130 initially determines whether or not the variation amount ratio as the ratio of the second maximum variation amount to the first maximum variation amount exceeds the predetermined value (S302). Specifically, the performance deterioration determiner 130 calculates the variation amount ratio $P_X/P_0$ by dividing the second maximum variation amount $P_X$ by the first maximum variation amount $P_0$. The performance deterioration determiner 130 then determines whether or not the calculated variation amount ratio $P_X/P_0$ exceeds the predetermined value set to the range from 0.7 to 0.8.

As indicated in FIG. 10A, if the operation degree of the energy storage device 200 at the second time point or the like corresponds to 50 cycles in the charge-discharge cycle test, the performance deterioration determiner 130 calculates the variation amount ratio $P_X/P_0=P_{50}/P_0=0.94$. Similarly, if the operation degree of the energy storage device 200 at the second time point corresponds to 300 cycles in the charge-discharge cycle test, the performance deterioration determiner 130 calculates the variation amount ratio $P_X/P_0=P_{300}/P_0=0.74$.

Referring again to FIG. 9, if the variation amount ratio is determined as exceeding the predetermined value (Yes in S302), the performance deterioration determiner 130 determines that the energy storage device 200 is in the performance deterioration start state at the second time point (S304). Specifically, the performance deterioration determiner 130 determines that the energy storage device 200 is in the performance deterioration start state at the second time point if the variation amount ratio is determined as exceeding the predetermined value set to the range from 0.7 to 0.8. More specifically, the performance deterioration determiner 130 determines that the energy storage device 200 is in an initial state of sudden deterioration in reversible capacity or input-output performance of the energy storage device 200 at the second time point if the variation amount ratio is determined as exceeding the predetermined value set to the range from 0.7 to 0.8, to determine that the energy storage device 200 is in the performance deterioration start state.

As indicated in FIG. 10A, if the operation degree of the energy storage device 200 at the second time point corresponds to 300 cycles in the charge-discharge cycle test (an example 1), the variation amount ratio is $P_X/P_0=P_{300}/P_0=0.74$, which is in the range from 0.7 to 0.8. Accordingly, the performance deterioration determiner 130 can determine at an appropriate time point that the energy storage device 200 is in the performance deterioration start state at the second time point if the predetermined value is set to the range from 0.7 to 0.8.

If the predetermined value is set to a value more than 0.8, the energy storage device 200 is not yet in the performance deterioration start state (too early timing for detection of sudden deterioration in performance). In this case, the performance deterioration determiner 130 cannot appropriately determine the performance deterioration start state. Similarly, if the predetermined value is set to a value less than 0.7, the energy storage device 200 is not any more in the performance deterioration start state (too late timing for detection of sudden deterioration in performance). In this case, the performance deterioration determiner 130 cannot appropriately determine the performance deterioration start state.

As indicated in FIG. 10B, when the energy storage device 200 is charged and discharged for 500 cycles in the charge-discharge cycle test (1 C cycle test) (when (cycle number)$^{1/2}$=22.4), the capacity retention ratio deteriorates suddenly and the energy storage device 200 comes into a deteriorating state. The energy storage device 200 charged and discharged for 300 cycles (when (cycle number)$^{1/2}$=17.3) is thus in an initial state of sudden deterioration in reversible capacity. The performance deterioration determiner 130 according to the present invention can correctly determine when the energy storage device 200 comes into the performance deterioration start state. The performance deterioration determiner 130 determines that the energy storage device 200 is in an initial state of sudden deterioration in reversible capacity of the energy storage device 200 at the second time point, to determine that the energy storage device 200 is in the performance deterioration start state at the second time point.

In contrast, as apparent from the values in the column "(cycle number)$^{1/2}$" in FIG. 10A and the dotted line in FIG. 10B obtained by plotting the values, the conventional technique based on the assumption that performance deteriorates in proportion to the root of the cycle number fails to determine when the energy storage device comes into the performance deterioration start state.

Similarly, as indicated in FIGS. 10C(a) to 10C(c), when the energy storage device 200 is charged and discharged for 500 cycles in the charge-discharge cycle test (1 C cycle test) (when (cycle number)$^{1/2}$=22.4), the output direct current resistance, the input direct current resistance, and the alternating current resistance of the energy storage device 200 increase suddenly. Accordingly, the output direct current resistance, the input direct current resistance, and the alternating current resistance of the energy storage device 200 start increasing suddenly when the energy storage device 200 is charged and discharged for 300 cycles (when (cycle number)$^{1/2}$=17.3).

The input-output performance deteriorates if the output direct current resistance, the input direct current resistance, or the alternating current resistance increases. When the energy storage device 200 is charged and discharged for 500 cycles (when (cycle number)$^{1/2}$=22.4), the input-output performance of the energy storage device 200 deteriorates suddenly and the energy storage device 200 comes into a deteriorating state. The energy storage device 200 charged and discharged for 300 cycles (when (cycle number)$^{1/2}$=17.3) is in an initial state of sudden deterioration in input-output performance of the energy storage device 200. The performance deterioration determiner 130 according to the present invention can correctly determine when the energy storage device 200 comes into the performance deterioration start state. The performance deterioration determiner 130 determines that the energy storage device 200 is in an initial state of sudden deterioration in input-output performance at the second time point, to determine that the energy storage device 200 is in the performance deterioration start state at the second time point.

In contrast, as apparent from the values in the column "(cycle number)$^{1/2}$" in FIG. 10A and the dotted lines in FIGS. 10C(a) to 10C(c) obtained by plotting the values, the conventional technique based on the assumption that performance deteriorates in proportion to the root of the cycle number fails to determine when the energy storage device comes into the performance deterioration start state.

The fact that the input-output performance expressed by the input-output property of an energy storage device (battery) deteriorates if the output direct current resistance, the input direct current resistance, or the alternating current resistance of the energy storage device increases will be described in detail below.

In order to initially obtain the input-output performance, the battery is prepared by charge and discharge until reaching a prescribed state of charge (SOC) (e.g. 50%). Energization with a discharge pulse (for the output property) and a charge pulse (for the input-output property) is then performed for prescribed energizing time (e.g. 10 or 60 seconds) at prescribed current rates (at least three times at different current rates such as 0.2, 0.5, and 1 C). In this case, auxiliary charge is performed after the discharge pulse as well as after the charge pulse.

A voltage value decreased after the discharge pulse (a voltage value increased after the charge pulse) (V) is plotted on the ordinate axis and a current value (I) is plotted on the transverse axis to validate whether or not linearity expressed by V=I×R+V0 is satisfied. In this equation, R and V0 denote resistance (of a negative value for the discharge pulse whereas a positive value for the charge pulse) and an open circuit voltage (OCV), respectively.

Calculated after the validation are the resistance (R) and the OCV (V0) at the discharge pulse and at the charge pulse. When the voltage of the required input-output performance is denoted by Vx, the input-output performance (W) is calculated by (Vx−V0)/R×Vx.

As apparent from this expression, the input-output performance (W) deteriorates if the resistance (R) such as the output direct current resistance, the input direct current resistance, or the alternating current resistance increases. Deterioration in input-output performance causes the following problem.

For example, in a lithium-ion secondary battery equipped in a hybrid electric vehicle (HEV), a plug-in hybrid electric vehicle (PHEV), or the like, stored power is used as driving power (for assisting activation and acceleration) for an electric motor. The secondary battery is charged by power generated by regenerative power generation of the electric motor, power generated by a dynamo configured to generate power along with rotation of an engine, and the like.

Deterioration in input-output performance (increase in resistance) of the secondary battery causes decrease in driving power for the electric motor. This leads to deterioration in assisting output property or deterioration in input property (charge acceptability) of storing energy as regenerative energy generated by regenerative power generation of the electric motor.

The output direct current resistance, the input direct current resistance, and the alternating current resistance indicated in FIGS. 10C(a) to 10C(c) are obtained by measuring in the following manners. The output direct current resistance is calculated as the resistance (R) by preparing the battery having the SOC of 50% through charge or discharge and energizing at the discharge rates of 0.2, 0.5, and 1 C with energizing time of 60 seconds (at 25° C.). Similarly, the input direct current resistance is calculated as the resistance (R) by preparing the battery having the SOC of 50% through charge or discharge and energizing at the charge rates of 0.2, 0.5, and 1 C with energizing time of 60 seconds (at 25° C.). The alternating current resistance is calculated as the resistance (R) by discharging the battery to have the SOC of 0% and measuring the alternating current resistance at the frequency of 1 kHz (at 25° C.).

As indicated in FIGS. 10A to 10C(c), sudden deterioration in reversible capacity and sudden increase in resistance occur at substantially the same timing. This is for the following reason. In capacity transition of the battery discharged under a prescribed condition (e.g. 1 C discharge), rate performance deteriorates at the end of the life of the secondary battery and capacity obtained by a flowing current thus deteriorates significantly. This causes sudden deterioration in capacity. Such deterioration in rate performance of the secondary battery is mainly caused by increase in direct current resistance and alternating current resistance of the battery according to progress of a life test. Transition of the resistance of the secondary battery, such as the output direct current resistance, the input direct current resistance, or the alternating current resistance, thus corresponds to transition of the reversible capacity of the secondary battery.

Referring again to FIG. 9, the performance deterioration determiner 130 limits the upper limit charging voltage of the energy storage device 200 or the maximum flowing current to the energy storage device 200 (S306). If the performance deterioration determiner 130 determines that the energy storage device 200 is in the performance deterioration start state at the second time point, the performance deterioration determiner 130 controls to suppress sudden deterioration in performance of the energy storage device.

The processes of determining that the energy storage device 200 is in the performance deterioration start state at the second time point with the performance deterioration determiner 130 (S106 in FIG. 5) thus end.

The fact that predetermined value referred to by the performance deterioration determiner 130 for determination of the performance deterioration start state is preferably in the range from 0.7 to 0.8 will be described next.

FIGS. 11 to 14C(c) include explanatory graphs and charts on the fact that the predetermined value referred to by the performance deterioration determiner 130 according to the embodiment of the present invention is preferably in the range from 0.7 to 0.8.

Figure 11:
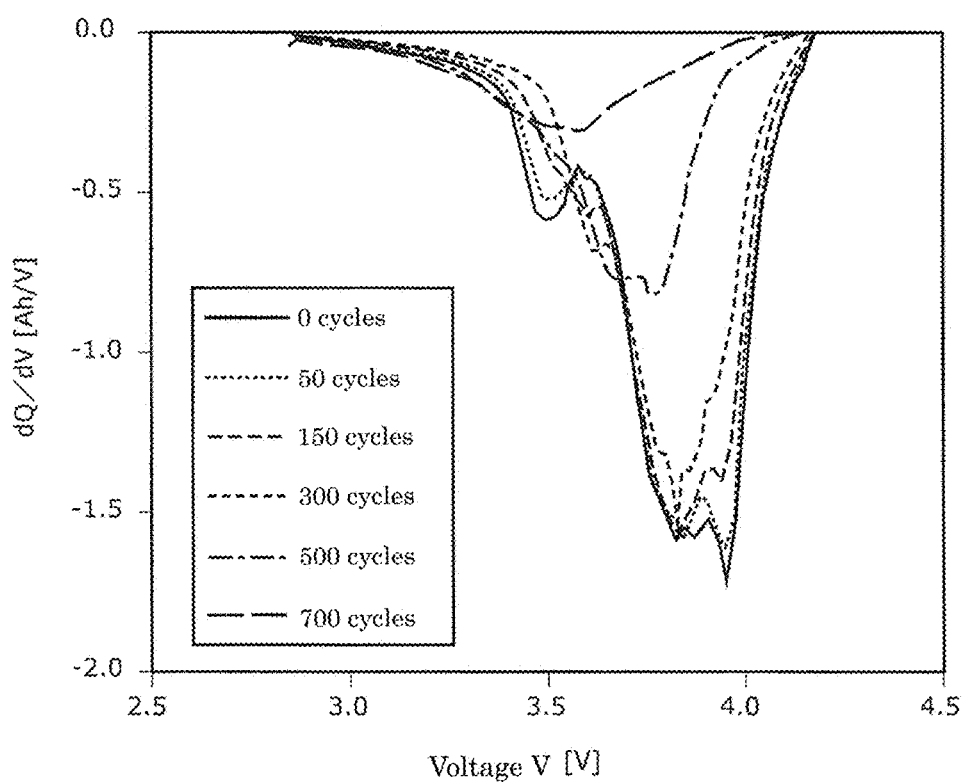
FIG. 11 is a graph of a capacity-voltage property of a battery B for explaining that a predetermined value referred to by the performance deterioration determiner according to the embodiment of the present invention is preferably in the range from 0.7 to 0.8.
Figure 12B:
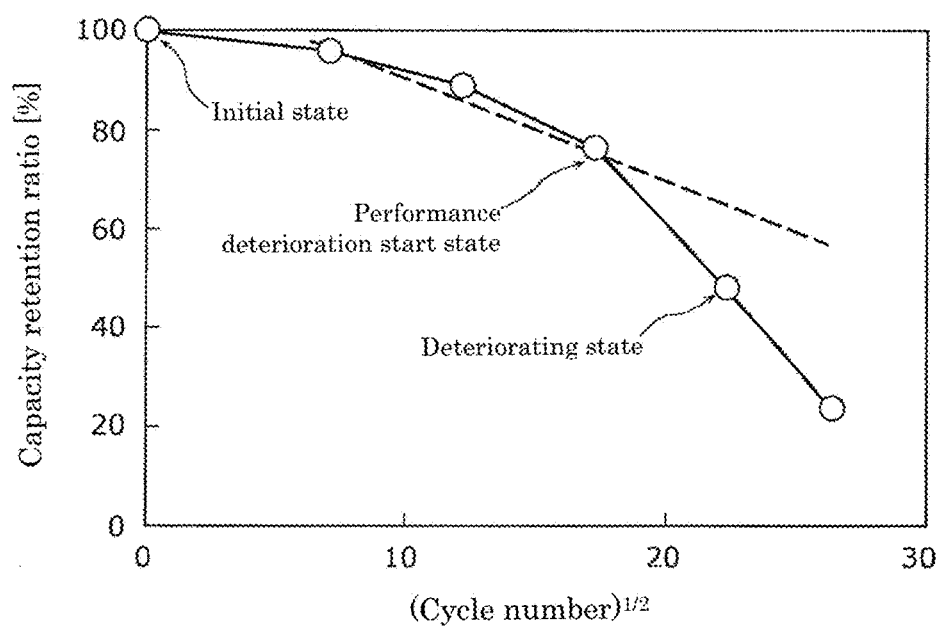
FIG. 12B is a graph indicating transition of a capacity retention ratio of the battery B for explaining that the predetermined value referred to by the performance deterioration determiner according to the embodiment of the present invention is preferably in the range from 0.7 to 0.8.
Figure 13:
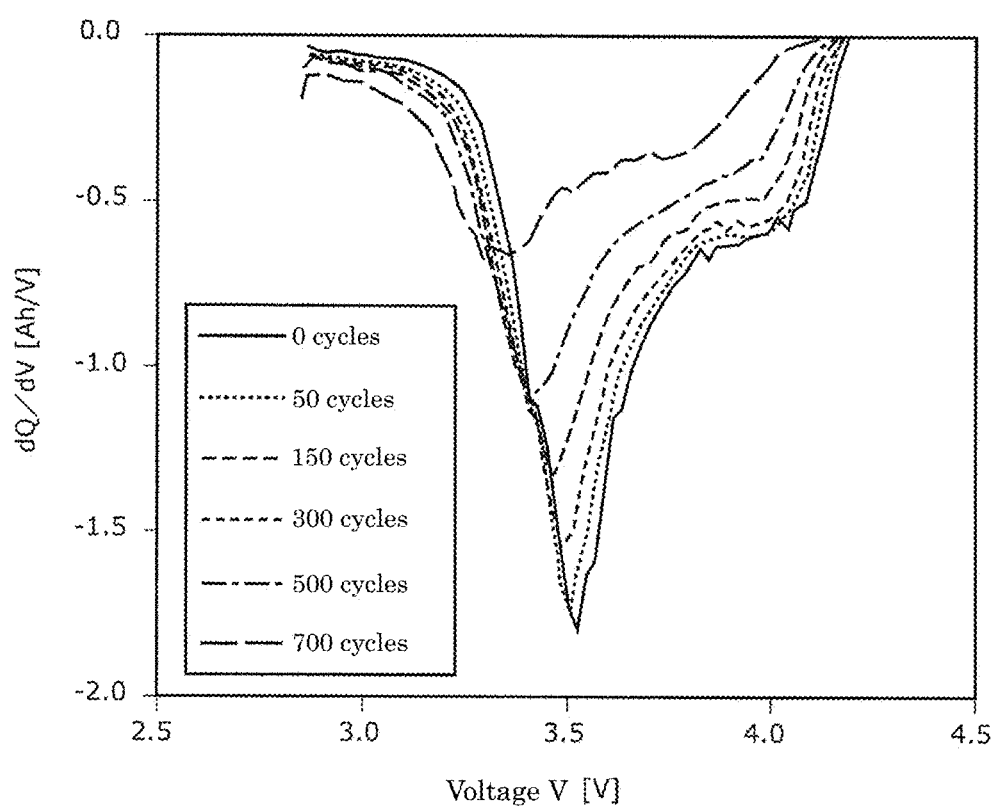
FIG. 13 is a graph of a capacity-voltage property of a battery C for explaining that a predetermined value referred to by the performance deterioration determiner according to the embodiment of the present invention is preferably in the range from 0.7 to 0.8.
Figure 14B:
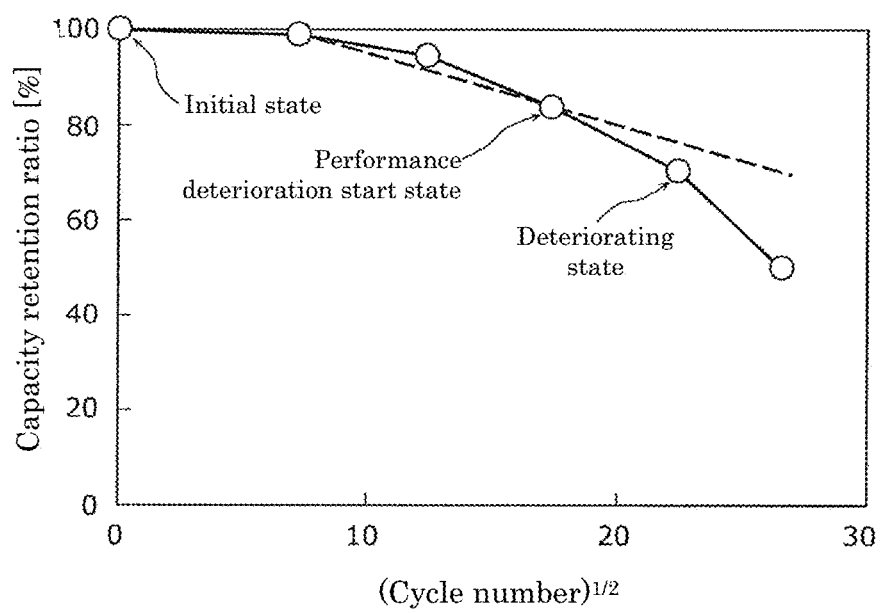
FIG. 14B is a graph indicating transition of a capacity retention ratio of the battery C for explaining that the predetermined value referred to by the performance deterioration determiner according to the embodiment of the present invention is preferably in the range from 0.7 to 0.8.

Specifically, FIGS. 11 and 13 are graphs of the capacity-voltage property of the energy storage device 200. FIGS. 12A and 14A are charts indicating values of the variation amount ratio according to the varied operation degree (cycle number) and determination results of the performance deterioration start state in a case where the values of the variation amount ratio are applied to the predetermined value. FIGS. 12B and 14B are graphs indicating transition of the capacity retention ratio of the energy storage device 200 according to the varied operation degree (cycle number).

Figure 12C:
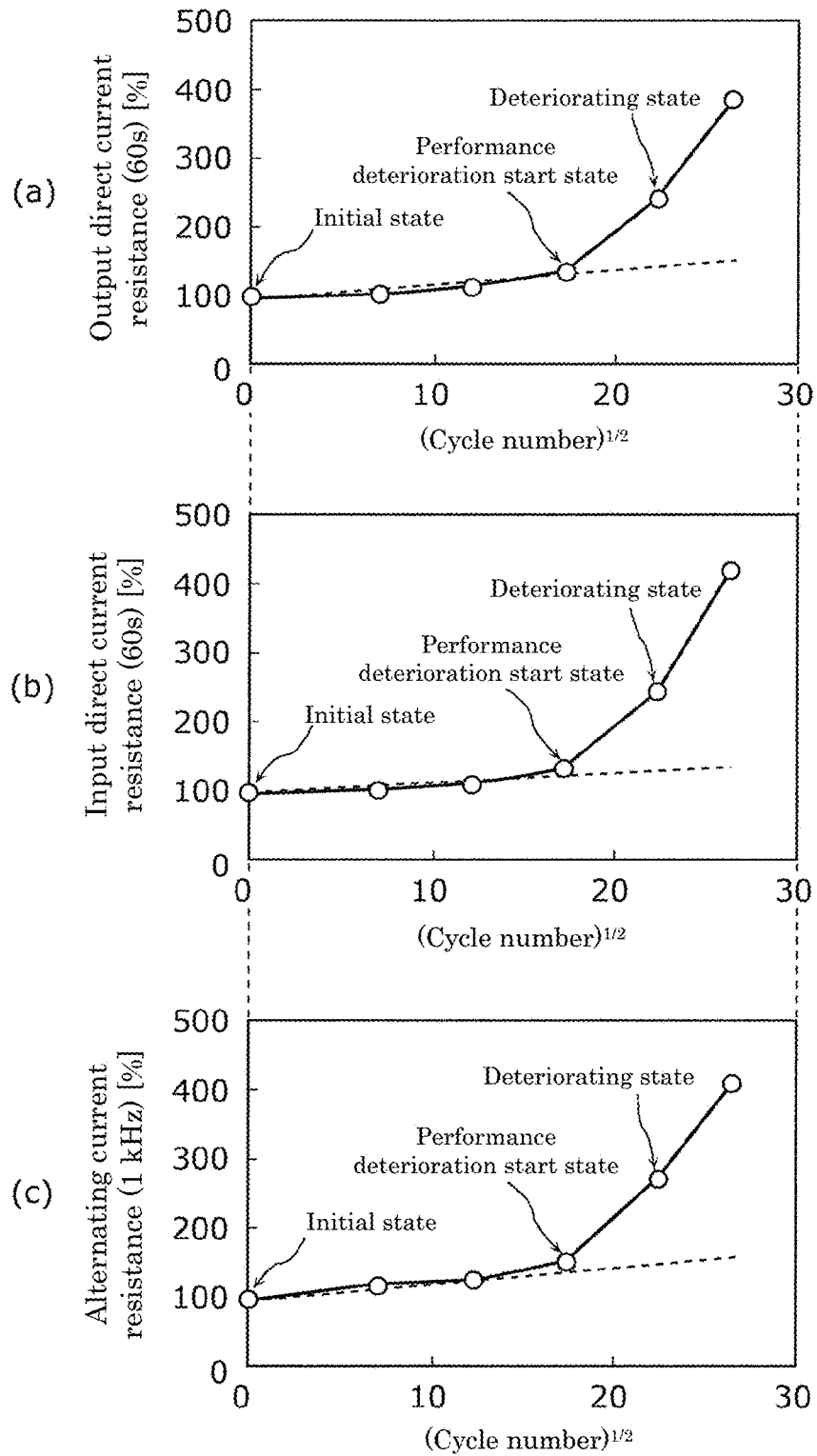
FIGS. 12C(a) to 12C(c) are graphs indicating transition of resistance of the battery B for explaining that the predetermined value referred to by the performance deterioration determiner according to the embodiment of the present invention is preferably in the range from 0.7 to 0.8.

FIGS. 12C(a) to 12C(c) and 14C(a) to 14C(c) are graphs indicating transition of the output direct current resistance, the input direct current resistance, and the alternating current resistance of the energy storage device 200 according to the varied operation degree (cycle number). Particularly, FIGS. 12C(a) and 14C(a) are graphs indicating transition of a ratio of the output direct current resistance of the energy storage device 200 according to the varied operation degree (cycle number) to the output direct current resistance in the initial state (an output direct current resistance increasing rate in FIGS. 12A and 14A). FIGS. 12C(b) and 14C(b) are graphs indicating transition of a ratio of the input direct current resistance of the energy storage device 200 according to the varied operation degree (cycle number) to the input direct current resistance in the initial state (an input direct current resistance increasing rate in FIGS. 12A and 14A). FIGS. 12C(c) and 14C(c) are graphs indicating transition of a ratio of the alternating current resistance of the energy storage device 200 according to the varied operation degree (cycle number) to the alternating current resistance in the initial state (an alternating current resistance increasing rate in FIGS. 12A and 14A).

How to measure the output direct current resistance, the input direct current resistance, and the alternating current resistance indicated in FIGS. 12C(a) to 12C(c) and 14C(a) to 14C(c) is similar to how to measure the output direct current resistance, the input direct current resistance, and the alternating current resistance indicated in FIGS. 10C(a) to 10C(c), and will not be described repeatedly.

FIGS. 11 and 13 indicate results of the 1 C cycle test at 45° C. similar to that described with reference to FIGS. 7 and 8. FIG. 11 indicates the capacity-voltage property of a lithium-ion secondary battery including a positive active material as a mixture of layered lithium transition metal oxide expressed by $LiNi_{1/3}Co_{1/3}Mn_{1/3}O_2$ and spinel lithium-manganese oxide expressed by $LiMn_2O_4$ (at the mass ratio of 3:7) (hereinafter, referred to as a battery B). FIG. 13 indicates the capacity-voltage property of a lithium-ion secondary battery including a positive active material of layered lithium transition metal oxide expressed by $LiNi_{1/3}Co_{1/3}Mn_{1/3}O_2$ (hereinafter, referred to as a battery C). The other configurations in the batteries B and C are similar to those in the battery A.

In the 1 C cycle test and the discharge capacity validation test regarding FIG. 11, charge is performed by constant-current constant-voltage charge at the current of 1 CmA (=600 mA) whereas discharge is performed by constant-current discharge at the current of 1 CmA (=600 mA). In the 1 C cycle test and the discharge capacity validation test regarding FIG. 13, charge is performed by constant-current constant-voltage charge at the current of 1 CmA (=700 mA) whereas discharge is performed by constant-current discharge at the current of 1 CmA (=700 mA). The other conditions for the 1 C cycle test and the discharge capacity validation test are similar to those described with reference to FIGS. 7 and 8, and will not be described in detail repeatedly.

The performance deterioration determiner 130 calculates the variation amount ratio $P_X/P_0$ as indicated in FIG. 12A, from the capacity-voltage property indicated in FIG. 11. If the operation degree of the energy storage device 200 at the second time point or the like corresponds to 50 cycles in the charge-discharge cycle test, the performance deterioration determiner 130 calculates the variation amount ratio $P_X/P_0=P_{50}/P_0=0.94$. Similarly, if the operation degree of the energy storage device 200 at the second time point corresponds to 300 cycles in the charge-discharge cycle test, the performance deterioration determiner 130 calculates the variation amount ratio $P_X/P_0=P_{300}/P_0=0.80$.

As indicated in FIG. 12B, when the energy storage device 200 is charged and discharged for 500 cycles in the charge-discharge cycle test (1 C cycle test) (when (cycle number)$^{1/2}$=22.4), the capacity retention ratio deteriorates suddenly and the energy storage device 200 comes into a deteriorating state. Accordingly, the reversible capacity of the energy storage device 200 starts deteriorating suddenly when the energy storage device 200 is charged and discharged for 300 cycles (when (cycle number)$^{1/2}$=17.3).

As indicated in FIGS. 12C(a) to 12C(c), when the energy storage device 200 is charged and discharged for 500 cycles in the charge-discharge cycle test (1 C cycle test) (when (cycle number)$^{1/2}$=22.4), the output direct current resistance, the input direct current resistance, and the alternating current resistance of the energy storage device 200 increase suddenly. Accordingly, the output direct current resistance, the input direct current resistance, and the alternating current resistance of the energy storage device 200 start increasing suddenly when the energy storage device 200 is charged and discharged for 300 cycles (when (cycle number)$^{1/2}$=17.3).

In this manner, the energy storage device 200 is in the performance deterioration start state at the variation amount ratio $P_X/P_0=P_{300}/P_0=0.80$ as indicated in FIG. 12A. The performance deterioration determiner 130 determines that the energy storage device 200 is in an initial state of sudden deterioration in reversible capacity or input-output performance of the energy storage device 200 if the variation amount ratio is 0.80 (exceeds the predetermined value set to a value less than 0.80), to determine that the energy storage device 200 is in the performance deterioration start state.

The performance deterioration determiner 130 calculates the variation amount ratio $P_X/P_0$ as indicated in FIG. 14A, from the capacity-voltage property indicated in FIG. 13. If the operation degree of the energy storage device 200 at the second time point or the like corresponds to 50 cycles, the performance deterioration determiner 130 calculates the variation amount ratio $P_X/P_0=P_{50}/P_0=0.97$. Similarly, if the operation degree of the energy storage device 200 at the second time point corresponds to 300 cycles, the performance deterioration determiner 130 calculates the variation amount ratio $P_X/P_0=P_{300}/P_0=0.71$.

As indicated in FIG. 14B, when the energy storage device 200 is charged and discharged for 500 cycles in the charge-discharge cycle test (when (cycle number)$^{1/2}$=22.4), the capacity retention ratio deteriorates suddenly and the energy storage device 200 comes into a deteriorating state. Accordingly, the reversible capacity of the energy storage device 200 starts deteriorating suddenly when the energy storage device 200 is charged and discharged for 300 cycles (when (cycle number)$^{1/2}$=17.3).

Figure 14C:
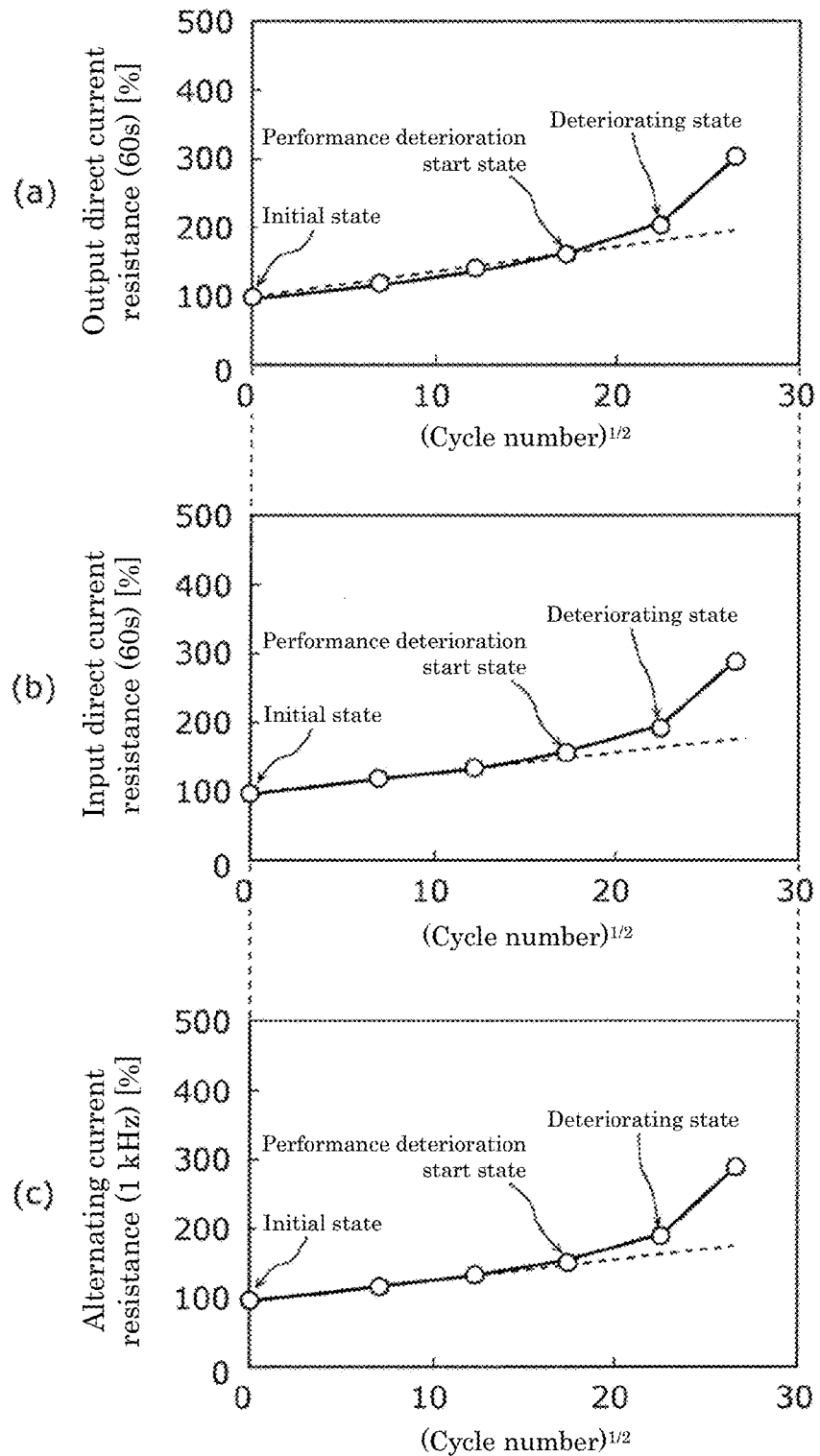
FIGS. 14C(a) to 14C(c) are graphs indicating transition of resistance of the battery C for explaining that the predetermined value referred to by the performance deterioration determiner according to the embodiment of the present invention is preferably in the range from 0.7 to 0.8.

As indicated in FIGS. 14C(a) to 14C(c), when the energy storage device 200 is charged and discharged for 500 cycles in the charge-discharge cycle test (1 C cycle test) (when (cycle number)$^{1/2}$=22.4), the output direct current resistance, the input direct current resistance, and the alternating current resistance of the energy storage device 200 increase suddenly. Accordingly, the output direct current resistance, the input direct current resistance, and the alternating current resistance of the energy storage device 200 start increasing suddenly when the energy storage device 200 is charged and discharged for 300 cycles (when (cycle number)$^{1/2}$=17.3).

In this manner, the energy storage device 200 is in the performance deterioration start state at the variation amount ratio $P_X/P_0=P_{300}/P_0=0.71$ as indicated in FIG. 14A. The performance deterioration determiner 130 determines that the energy storage device 200 is in an initial state of sudden deterioration in reversible capacity or input-output performance of the energy storage device 200 if the variation amount ratio is 0.71 (exceeds the predetermined value set to a value less than 0.71), to determine that the energy storage device 200 is in the performance deterioration start state.

Accordingly, the performance deterioration determiner 130 can correctly determine when the energy storage device 200 comes into the performance deterioration start state if the predetermined value is set to the range from 0.7 to 0.8. The predetermined value referred to by the performance deterioration determiner 130 is thus preferably in the range from 0.7 to 0.8.

A case of referring to the capacity-voltage property of the charged energy storage device 200 will be described next. In the above case, the performance deterioration detecting apparatus 100 acquires the capacity-voltage property indicated in FIG. 11 as a differential property of a discharge curve of the discharged energy storage device 200. In the following case, the performance deterioration detecting apparatus 100 acquires the capacity-voltage property as a differential property of a charge curve of the charged energy storage device 200.

Figure 15:
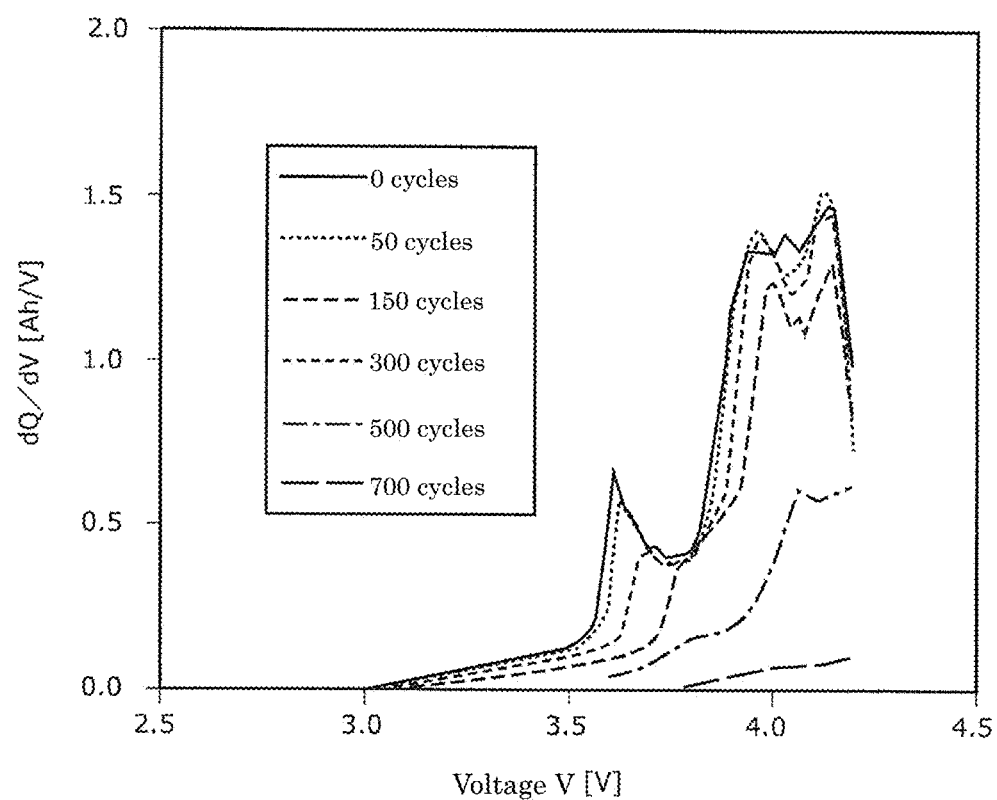
FIG. 15 is a graph of a capacity-voltage property as a differential property of a charge curve of the energy storage device according to the embodiment of the present invention.

FIG. 15 is a graph of the capacity-voltage property as the differential property of the charge curve of the energy storage device 200 according to the embodiment of the present invention. FIG. 16 is a chart of determination results of the performance deterioration start state in the case of acquiring the capacity-voltage property as the differential property of the charge curve of the energy storage device 200 according to the embodiment of the present invention. These figures indicate the results of the battery B.

As indicated in these figures, the performance deterioration determiner 130 can determine that the energy storage device 200 is in the performance deterioration start state if the variation amount ratio exceeds the predetermined value in the range from 0.7 to 0.8 by referring to the capacity-voltage property acquired by charging the energy storage device 200, similarly to the case of referring to the capacity-voltage property acquired by discharging the energy storage device 200. The performance deterioration detecting apparatus 100 can thus accurately detect an initial state of sudden deterioration in performance of the energy storage device 200 also by referring to the capacity-voltage property acquired by charging the energy storage device 200.

A case of referring to the capacity-voltage property of the energy storage device 200 subjected to a 0.2 C discharge capacity validation test will be described next. In the above case, the performance deterioration detecting apparatus 100 acquires the capacity-voltage property indicated in FIG. 11 as the differential property of the discharge curve of the energy storage device 200 subjected to the 1 C discharge capacity validation test. In the following case, the performance deterioration detecting apparatus 100 acquires the capacity-voltage property as the differential property of the discharge curve of the energy storage device 200 subjected to the 0.2 C discharge capacity validation test.

Figure 17:
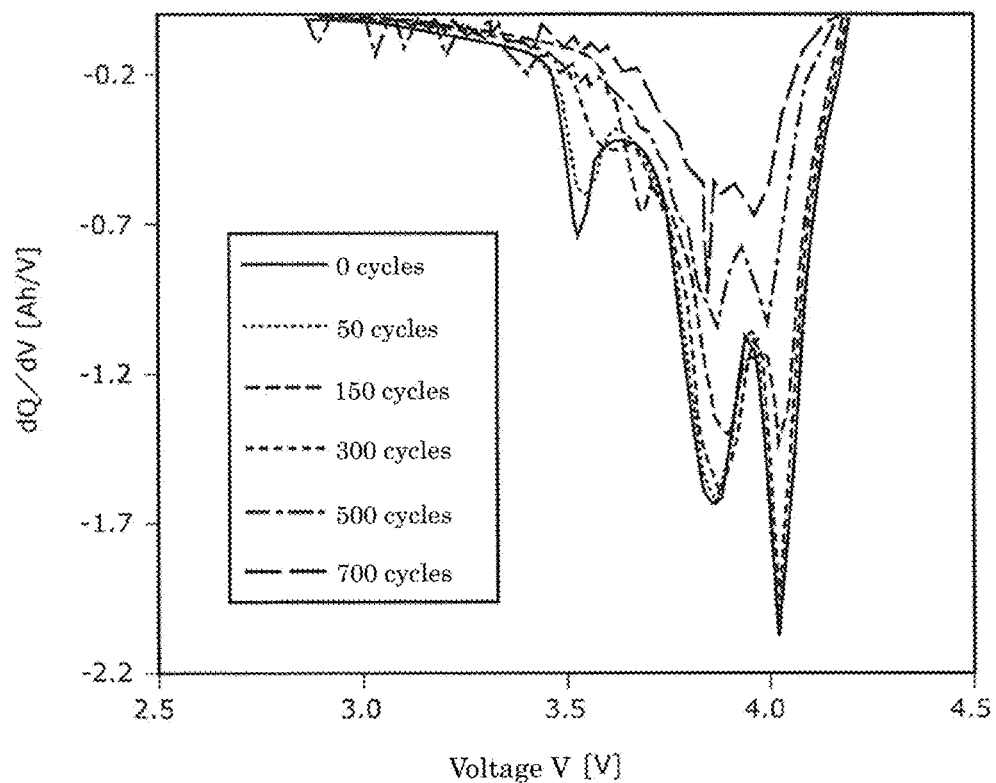
FIG. 17 is a graph of the capacity-voltage property of the energy storage device according to the embodiment of the present invention subjected to a 0.2 C discharge capacity validation test.

FIG. 17 is a graph of the capacity-voltage property of the energy storage device 200 according to the embodiment of the present invention subjected to the 0.2 C discharge capacity validation test. FIG. 18 is a chart of determination results of the performance deterioration start state in the case of acquiring the capacity-voltage property of the energy storage device 200 according to the embodiment of the present invention subjected to the 0.2 C discharge capacity validation test. These figures indicate the results of the battery B.

As indicated in these figures, the performance deterioration determiner 130 can determine that the energy storage device 200 is in the performance deterioration start state if the variation amount ratio exceeds the predetermined value in the range from 0.7 to 0.8 by referring to the capacity-voltage property of the energy storage device 200 subjected to the 0.2 C discharge capacity validation test, similarly to the case of referring to the capacity-voltage property acquired through the 1 C discharge capacity validation test. The performance deterioration detecting apparatus 100 can thus accurately detect an initial state of sudden deterioration in performance of the energy storage device 200 also by referring to the capacity-voltage property of the energy storage device 200 subjected to the 0.2 C discharge capacity validation test.

As described above, the performance deterioration detecting apparatus 100 can accurately detect an initial state of sudden deterioration in performance of the energy storage device 200 even at a current rate other than 1 C, without being limited to 1 C, in the discharge capacity validation test. The current rate can be not less than 1 C or can be not more than 1 C, but is preferably not more than 1 C on average for more accurate detection.

A case of changing the voltage variation amount for acquisition of the capacity-voltage property will be described next. For example, FIG. 11 indicates the capacity-voltage property with the interval 0.02 V of the voltage variation amount (dV) in the capacity variation amount (dQ/dV) on the ordinate axis regarding the capacity-voltage property. The performance deterioration detecting apparatus 100 acquires the capacity-voltage property according to the relation between the capacity variation amount (dQ/dV) and the voltage (V) plotted with the voltage variation amount (dV) referred to at the interval of 0.02 V. In the following case, the performance deterioration detecting apparatus 100 acquires the capacity-voltage property according to the relation between the capacity variation amount (dQ/dV) and the voltage (V) plotted with the voltage variation amount (dV) referred to at the interval of 0.04 V.

Figure 19:
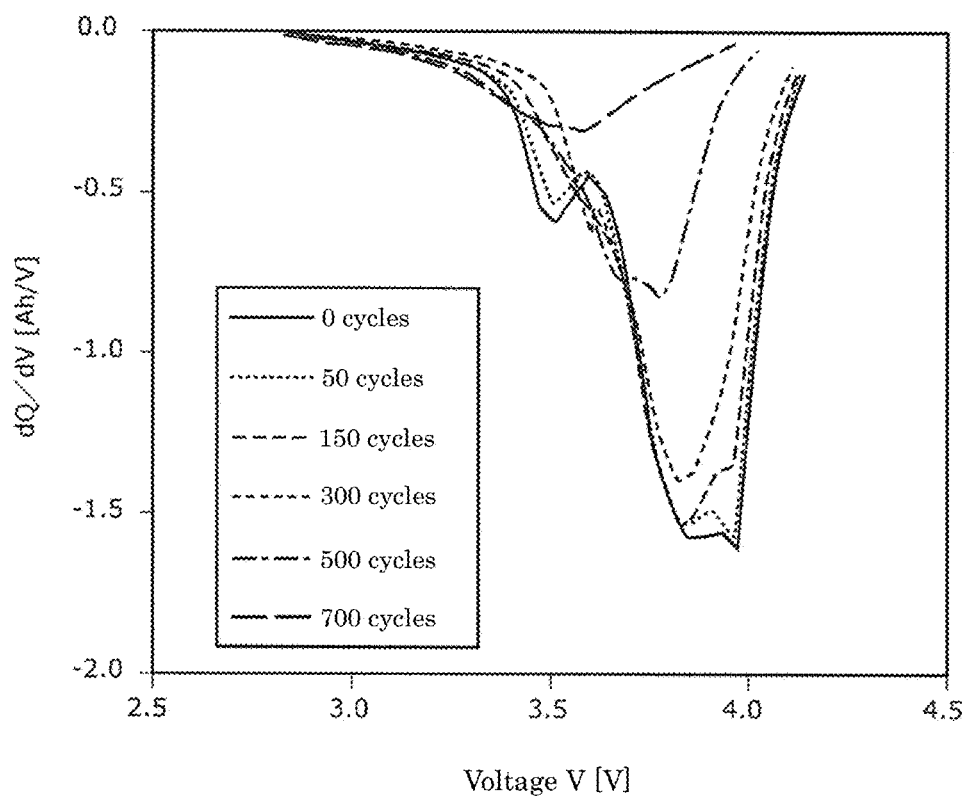
FIG. 19 is a graph of the capacity-voltage property of the energy storage device according to the embodiment of the present invention with an interval of a voltage variation amount being changed.

FIG. 19 is a graph of the capacity-voltage property of the energy storage device 200 according to the embodiment of the present invention with the interval of the voltage variation amount being changed. FIG. 20 is a chart of determination results of the performance deterioration start state in the case of acquiring the capacity-voltage property of the energy storage device 200 according to the embodiment of the present invention with the interval of the voltage variation amount being changed. These figures indicate the results of the battery B.

As indicated in these figures, the performance deterioration determiner 130 can determine that the energy storage device 200 is in the performance deterioration start state if the variation amount ratio exceeds the predetermined value in the range from 0.7 to 0.8 by referring to the capacity-voltage property of the energy storage device 200 acquired with the interval of the voltage variation amount changed to 0.04 V, similarly to the case of referring to the capacity-voltage property acquired with the interval 0.02 V of the voltage variation amount. The performance deterioration detecting apparatus 100 can thus accurately detect an initial state of sudden deterioration in performance of the energy storage device 200 also by referring to the capacity-voltage property of the energy storage device 200 acquired with the interval of the voltage variation amount changed to 0.04V.

As described above, the performance deterioration detecting apparatus 100 can accurately detect an initial state of sudden deterioration in performance of the energy storage device 200 even at an interval other than 0.02 V, without being limited to 0.02 V, of the voltage variation amount if the interval is constant. The interval of the voltage variation amount can have any value, but is preferably from 0.01 V to 0.05 V for more accurate detection.

As described above, the performance deterioration detecting apparatus 100 according to the embodiment of the present invention determines that the energy storage device 200 is in the performance deterioration start state at the second time point if the variation amount ratio as the ratio of the maximum value of the capacity variation amount at the second time point to the maximum value of the capacity variation amount at the first time point exceeds the predetermined value, regarding the capacity-voltage property indicating the relation between the capacity variation amount as the degree of variation in current carrying capacity relative to variation in voltage of the energy storage device 200 and the voltage. The inventors of the present application have found, through intensive studies and tests, that the energy storage device 200 starts deteriorating suddenly in performance at the second time point if the variation amount ratio exceeds the predetermined value.

In the capacity-voltage property (dQ/dV-V property) calculated from the discharge curve of the battery capacity obtained by discharging under a prescribed condition (e.g. 1 C discharge) (or the charge curve obtained by charging), electrochemical performance of the positive electrode and the negative electrode having polarization dependence can be regarded as a phase change. Assume that the negative electrode has a long plateau region in an actual operation region of the battery. In this case, deterioration in rate performance of the battery is regarded as being caused mainly by deterioration in unipolar and rate performance of the positive active material. It has been accordingly found that deterioration of the positive active material can be detected in accordance with the capacity-voltage property of the battery. For example, deterioration in capacity of the battery narrows the plateau range appearing at constant battery potential. Accordingly, the capacity variation amount dependent on the plateau decreases when Q is differentiated with respect to V in the V-Q property.

The performance deterioration detecting apparatus 100 can thus accurately detect an initial state of sudden deterioration in performance of the energy storage device 200. The performance deterioration detecting apparatus 100 can correctly specify timing for replacement of a lithium-ion secondary battery for a movable body or the like.

The inventors of the present application have found, through intensive studies and tests, that the reversible capacity or the input-output performance of the energy storage device 200 starts deteriorating suddenly at the second time point if the variation amount ratio exceeds the predetermined value. The fact that the reversible capacity or the input-output performance of the energy storage device 200 starts deteriorating suddenly indicates that the performance of the energy storage device 200 starts deteriorating suddenly. The performance deterioration detecting apparatus 100 thus detects that the reversible capacity or the input-output performance of the energy storage device 200 starts deteriorating suddenly so as to accurately detect an initial state of sudden deterioration in performance of the energy storage device 200.

The inventors of the present application have found, through intensive studies and tests, that the energy storage device 200 starts deteriorating suddenly in performance at the second time point if the variation amount ratio exceeds the predetermined value in the range from 0.7 to 0.8. The performance deterioration detecting apparatus 100 can thus accurately detect an initial state of sudden deterioration in performance of the energy storage device 200.

The performance deterioration detecting apparatus 100 acquires, as the first maximum variation amount, the maximum value of the capacity variation amount regarding the capacity-voltage property of the energy storage device 200 in the initial state. In a case where the performance deterioration detecting apparatus 100 preliminarily stores in a memory the maximum value of the capacity variation amount of the energy storage device 200 in the initial state, such as at production, factory shipment, or charge-discharge start, the performance deterioration detecting apparatus 100 can easily acquire the first maximum variation amount.

The performance deterioration detecting apparatus 100 charges or discharges the energy storage device 200 at the second time point to acquire the capacity-voltage property, and can thus easily acquire the second maximum variation amount.

The performance deterioration detecting apparatus 100 limits the upper limit charging voltage of the energy storage device 200 if the performance deterioration detecting apparatus 100 determines that the energy storage device 200 is in the performance deterioration start state at the second time point. The performance deterioration detecting apparatus 100 can thus suppress sudden deterioration in performance of the energy storage device 200 and extend its life.

The performance deterioration detecting apparatus 100 limits the maximum flowing current to the energy storage device 200 if the performance deterioration detecting apparatus 100 determines that the energy storage device 200 is in the performance deterioration start state at the second time point. The performance deterioration detecting apparatus 100 can thus suppress sudden deterioration in performance of the energy storage device 200 and extend its life.

The energy storage device 200 is a lithium-ion secondary battery including layered lithium transition metal oxide as the positive active material. The inventors of the present application have found, through intensive studies and tests, that the above method achieves preliminary accurate detection of sudden deterioration in performance of the energy storage device 200 that is embodied as the lithium-ion secondary battery. The performance deterioration detecting apparatus 100 can thus accurately detect an initial state of sudden deterioration in performance of the lithium-ion secondary battery.

The energy storage system 10 and the performance deterioration detecting apparatus 100 according to the embodiment of the present invention have been described above. The present invention, however, should not be limited to this embodiment. The embodiment disclosed herein should be regarded as being exemplary and nonlimitative in all aspects. The scope of the present invention is recited not by the above description but by the claims, and is intended to include meanings equivalent to the claims and any modification within the scope.

For example, the first acquiring unit 110 according to the above embodiment reads out to acquire the first maximum variation amount from the determination data 151. The first acquiring unit 110 can alternatively acquire the first maximum variation amount in a manner similar to how the second acquiring unit 120 acquires the second maximum variation amount. Specifically, the first acquiring unit 110 can charge or discharge the energy storage device 200 at the first time point to acquire the relation between the voltage and the current carrying capacity of the energy storage device 200, calculate the capacity variation amount by differentiating the current carrying capacity with respect to the voltage in accordance with the acquired relation, and acquire the capacity-voltage property indicating the relation between the calculated capacity variation amount and the voltage, so as to acquire the first maximum variation amount.

Depending on the timing (the first time point) of acquiring the first maximum variation amount with the first acquiring unit 110, the criterion for determination of the performance deterioration start state with the performance deterioration determiner 130 (the variation amount ratio from 0.7 to 0.8 in the above case) has a different value. In view of this, the first time point is preferably before factory shipment of the energy storage device 200, after the energy storage device 200 is installed in applied equipment and before a user actually starts using the energy storage device 200, or as early as possible after the user actually starts using the energy storage device 200. Even in a case where the first time point is not set as exemplified above, the performance deterioration determiner 130 can appropriately determine the performance deterioration start state of the energy storage device 200 by acquiring an appropriate criterion inputted by a user, calculating an appropriate criterion by the performance deterioration determiner 130 itself, or the like.

The performance deterioration detecting apparatus 100 according to the above embodiment detects the performance deterioration start state in accordance with the variation amount ratio calculated from the variation in value of the capacity variation amount (on the ordinate axis) at the peak position of the maximum capacity variation amount regarding the capacity-voltage property. The performance deterioration detecting apparatus 100 can alternatively detect the performance deterioration start state in accordance with the variation in value of the battery voltage (on the transverse axis) at the peak position of the maximum capacity variation amount regarding the capacity-voltage property. In other words, the performance deterioration detecting apparatus 100 can detect the performance deterioration start state in consideration of transverse displacement of the peak position of the capacity variation amount regarding the capacity-voltage property.

The present invention can be embodied as the energy storage system 10 or the performance deterioration detecting apparatus 100, as well as a performance deterioration detecting method including the steps performed by characteristic processors included in the performance deterioration detecting apparatus 100.

Figure 21:
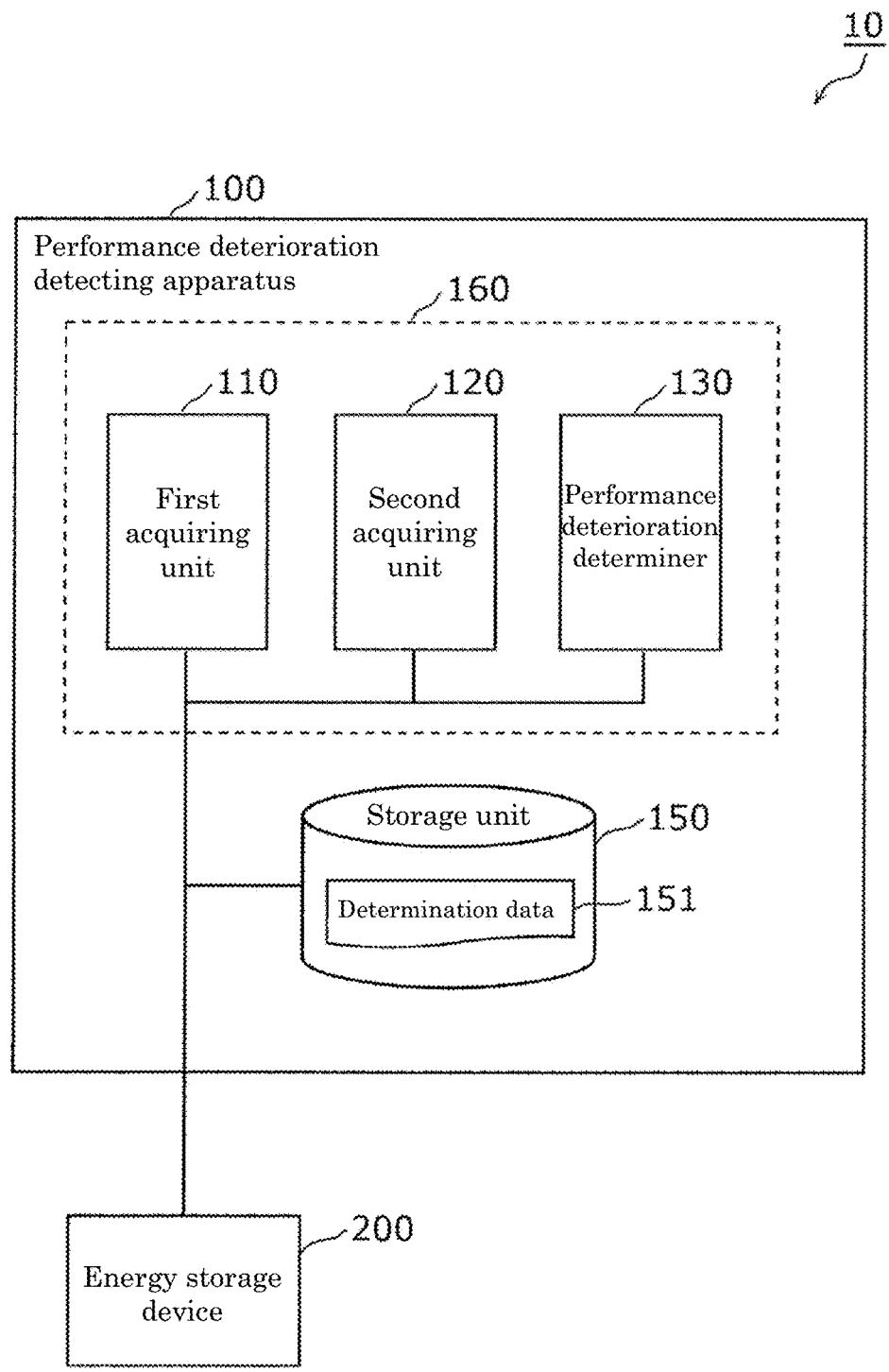
FIG. 21 is a block diagram depicting a configuration embodied as an integrated circuit, of the performance deterioration detecting apparatus according to the embodiment of the present invention.

Each of the processors included in the performance deterioration detecting apparatus 100 according to the present invention can be embodied as a large scale integration (LSI) serving as an integrated circuit. As exemplified in FIG. 21, the present invention can be embodied as an integrated circuit 160 including the first acquiring unit 110, the second acquiring unit 120, and the performance deterioration determiner 130. FIG. 21 is a block diagram depicting a configuration embodied as the integrated circuit, of the performance deterioration detecting apparatus 100 according to the embodiment of the present invention.

The processors included in the integrated circuit 160 can be provided as separate chips, or can be provided as a single chip partially or entirely including the processors. The LSI herein can be called an IC, a system LSI, a super LSI, or an ultra LSI depending on differences in integration degree.

Circuit integration is not limited to the LSI, but can be alternatively embodied as a dedicated circuit or a general purpose processor. Still alternatively, a field programmable gate array (FPGA) or a reconfigurable processor in terms of connection or setting of a circuit cell in the LSI can be applied after fabrication of the LSI.

If development in semiconductor technology or different derivative technology leads to technology for circuit integration to replace the LSI, functional blocks can be obviously integrated in accordance with the technology. For example, biotechnology will be possibly applicable.

Moreover, the present invention can be embodied as a program configured to cause a computer to execute the characteristic processes included in the performance deterioration detecting method, or can be embodied as a non-temporary recording medium that is readable with a computer storing the program, such as a flexible disk, a hard disk, a CD-ROM, an MO, a DVD, a DVD-ROM, a DVD-RAM, a Blu-ray Disc (registered trademark; BD), or a semiconductor memory. Such a program can be obviously distributed by means of a recording medium such as a CD-ROM or through a transmission medium such as the Internet.

INDUSTRIAL APPLICABILITY

The present invention is applicable to a performance deterioration detecting apparatus or the like configured to accurately detect an initial state of sudden deterioration in performance of an energy storage device such as a lithium-ion secondary battery.

DESCRIPTION OF REFERENCE SIGNS

10 Energy storage system
100 Performance deterioration detecting apparatus
110 First acquiring unit
120 Second acquiring unit
130 Performance deterioration determiner
150 Storage unit
151 Determination data
160 Integrated circuit
200 Energy storage device
300 Case

The invention claimed is:

1. A performance deterioration detecting apparatus configured to detect a performance deterioration start state of an energy storage device, wherein the performance deterioration start state is an initial state of deterioration in performance of the energy storage device, the apparatus comprising:
   a first acquiring unit configured to acquire a first maximum variation amount regarding a capacity-voltage property of the energy storage device, the first maximum variation amount is a maximum value of a capacity variation amount at a first time point;
   a second acquiring unit configured to acquire a second maximum variation amount regarding the capacity-voltage property, the second maximum variation amount is a maximum value of the capacity variation amount at a second time point; and
   a performance deterioration determiner configured to determine at the second time point that the energy storage device is in the performance deterioration start state, the second time point occurs after the first time point,
   wherein the energy storage device is in the performance deterioration start state if a variation amount ratio exceeds a predetermined value, the variation amount ratio is a ratio of the second maximum variation amount to the first maximum variation amount, and
   wherein a relation between the capacity variation amount and a voltage of the energy storage device is the capacity-voltage property, a degree of variation in a current carrying capacity of the energy storage device relative to a variation in voltage of the energy storage device is the capacity variation amount.

2. The performance deterioration detecting apparatus according to claim 1, wherein
   the performance deterioration determiner is configured to determine that the energy storage device is in the performance deterioration start state by determining at the second time point that the energy storage device is in an initial state of sudden deterioration in chargeable or dischargeable capacity of the energy storage device or in an initial state of sudden deterioration in input-output performance indicated by an input-output property of the energy storage device if the variation amount ratio exceeds the predetermined value.

3. The performance deterioration detecting apparatus according to claim 1, wherein
   the performance deterioration determiner is configured to determine that the energy storage device is in the performance deterioration start state at the second time point if the variation amount ratio exceeds the predetermined value set to a range from 0.7 to 0.8.

4. The performance deterioration detecting apparatus according to claim 1, wherein
   the first acquiring unit is configured to acquire the first maximum variation amount when the energy storage device is in the initial state.

5. The performance deterioration detecting apparatus according to claim 1, wherein the second acquiring unit is configured to:
   charge or discharge the energy storage device at the second time point to acquire a relation between the voltage and the current carrying capacity of the energy storage device,
   calculate the capacity variation amount by differentiating the current carrying capacity with respect to the voltage in accordance with the relation between the voltage and the current carrying capacity of the energy storage device, and
   acquire the capacity-voltage property indicating the relation between the capacity variation amount and the voltage to acquire the second maximum variation amount.

6. The performance deterioration detecting apparatus according to claim 1, wherein
   the performance deterioration determiner is configured to limit an upper limit charging voltage of the energy storage device if the performance deterioration determiner determines that the energy storage device is in the performance deterioration start state at the second time point.

7. The performance deterioration detecting apparatus according to claim 1, wherein
   the performance deterioration determiner is configured to limit a maximum flowing current to the energy storage device if the performance deterioration determiner determines that the energy storage device is in the performance deterioration start state at the second time point.

8. The performance deterioration detecting apparatus according to claim 1, wherein
   the energy storage device is a lithium-ion secondary battery that includes layered lithium transition metal oxide as a positive active material,
   the first acquiring unit is configured to acquire the first maximum variation amount of the lithium-ion secondary battery, and
   the second acquiring unit is configured to acquire the second maximum variation amount of the lithium-ion secondary battery.

9. An energy storage system comprising:
   the performance deterioration detecting apparatus according to claim 1; and
   the energy storage device.

10. A performance deterioration detecting method of detecting a performance deterioration start state of an energy storage device, wherein the performance deterioration start state is an initial state of deterioration in performance of the energy storage device, the method comprising:
    electronically acquiring, by a first acquiring unit, a first maximum variation amount regarding a capacity-voltage property of the energy storage device, the first maximum variation amount is a maximum value of a capacity variation amount at a first time point;
    electronically acquiring, by a second acquiring unit, a second maximum variation amount regarding the capacity-voltage property of the energy storage device, the second maximum variation amount is a maximum value of the capacity variation amount at a time point later than the first time point; and
    electronically determining, by a performance deterioration determiner, whether or not a ratio of the second maximum variation amount to the first maximum variation amount exceeds a predetermined value, the energy storage device is in the performance deterioration start state if the ratio exceeds the predetermined value,
    wherein a relation between the capacity variation amount and a voltage of the energy storage device is the capacity-voltage property, a degree of variation in a current carrying capacity of the energy storage device relative to a variation in voltage of the energy storage device is the capacity variation amount.

11. An integrated circuit configured to detect a performance deterioration start state of an energy storage device, wherein the performance deterioration start state is an initial state of deterioration in performance of the energy storage device, the integrated circuit comprising:
- a first acquiring unit configured to acquire a first maximum variation amount regarding a capacity-voltage property of the energy storage device, the first maximum variation amount is a maximum value of a capacity variation amount at a first time point;
- a second acquiring unit configured to acquire a second maximum variation amount regarding the capacity-voltage property, the second maximum variation amount is a maximum value of the capacity variation amount at a second time point; and
- a performance deterioration determiner configured to determine at the second time point that the energy storage device is in the performance deterioration start state, the second time point occurs after the first time point,
wherein the energy storage device is in the performance deterioration start state if a variation amount ratio exceeds a predetermined value, the variation amount ratio is a ratio of the second maximum variation amount to the first maximum variation amount, and
wherein a relation between the capacity variation amount and a voltage of the energy storage device is the capacity-voltage property, a degree of variation in a current carrying capacity of the energy storage device relative to a variation in voltage of the energy storage device is the capacity variation amount.

\* \* \* \* \*